US011051099B2

(12) United States Patent
Saito et al.

(10) Patent No.: US 11,051,099 B2
(45) Date of Patent: Jun. 29, 2021

(54) SOUND REPRODUCTION DEVICE AND SOUND REPRODUCTION SYSTEM

(71) Applicant: Panasonic Intellectual Property Management Co., Ltd., Osaka (JP)

(72) Inventors: Takao Saito, Nara (JP); Sumio Tate, Fukuoka (JP); Makoto Takashiro, Osaka (JP); Yasunobu Tsukio, Osaka (JP); Fumiyasu Konno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 69 days.

(21) Appl. No.: 16/308,056

(22) PCT Filed: Jul. 14, 2017

(86) PCT No.: PCT/JP2017/025686
§ 371 (c)(1),
(2) Date: Dec. 7, 2018

(87) PCT Pub. No.: WO2018/016432
PCT Pub. Date: Jan. 25, 2018

(65) Prior Publication Data
US 2019/0313183 A1 Oct. 10, 2019

(30) Foreign Application Priority Data
Jul. 21, 2016 (JP) .............................. JP2016-143426

(51) Int. Cl.
*H04R 1/00* (2006.01)
*H04R 1/40* (2006.01)
(Continued)

(52) U.S. Cl.
CPC ............. *H04R 1/403* (2013.01); *G08B 15/00* (2013.01); *G08B 25/00* (2013.01);
(Continued)

(58) Field of Classification Search
CPC ...... H04R 2217/03; H04R 1/323; H04R 1/40; H04R 1/403; H04R 2201/401;
(Continued)

(56) References Cited

U.S. PATENT DOCUMENTS

2016/0336022 A1* 11/2016 Florencio ................. H04R 3/12
2018/0321381 A1* 11/2018 Cohen ..................... G01S 15/88
2019/0313183 A1 10/2019 Saito et al.

FOREIGN PATENT DOCUMENTS

CN 204856286 U 12/2015
JP 9-237390 9/1997
(Continued)

OTHER PUBLICATIONS

International Search Report of PCT application No. PCT/JP2017/025686 dated Oct. 10, 2017.
(Continued)

*Primary Examiner* — Matthew A Eason
(74) *Attorney, Agent, or Firm* — McDermott Will and Emery LLP

(57) ABSTRACT

A sound reproduction device of the present disclosure includes a detection device that detects an object in a detecting area, and a superdirective speaker that can output a sound. In the superdirective speaker, directivity is set for the detecting area. When the detection device detects the object in the detecting area, the superdirective speaker outputs a sound to the detecting area.

24 Claims, 24 Drawing Sheets

(51) Int. Cl.
  *H01L 41/08* (2006.01)
  *H04R 1/32* (2006.01)
  *H04R 5/02* (2006.01)
  *G08B 15/00* (2006.01)
  *G08B 25/00* (2006.01)

(52) U.S. Cl.
  CPC ......... *H01L 41/0825* (2013.01); *H04R 1/323* (2013.01); *H04R 1/40* (2013.01); *H04R 5/02* (2013.01); *H04R 2203/12* (2013.01)

(58) Field of Classification Search
  CPC ...... H04R 17/00; H04R 5/02; H04R 2203/12; H04R 3/12; G08B 15/00; G08B 25/00
  See application file for complete search history.

(56) References Cited

FOREIGN PATENT DOCUMENTS

| | | |
|---|---|---|
| JP | 2004-258937 | 9/2004 |
| JP | 2005-080227 | 3/2005 |
| JP | 2006-185127 | 7/2006 |
| JP | 2007-233679 | 9/2007 |
| JP | 2014-194607 | 10/2014 |
| JP | 2018-016432 A1 | 7/2018 |

OTHER PUBLICATIONS

English Translation of Chinese Search Report dated May 7, 2020 for the related Chinese Patent Application No. 201780039231.5.

\* cited by examiner

SOUND REPRODUCTION DEVICE AND SOUND REPRODUCTION SYSTEM

CROSS-REFERENCE TO RELATED APPLICATIONS

This application is a U.S. national stage application of the PCT International Application No. PCT/JP2017/025686 filed on Jul. 14, 2017, which claims the benefit of foreign priority of Japanese patent application No. 2016-143426 filed on Jul. 21, 2016, the contents all of which are incorporated herein by reference.

TECHNICAL FIELD

The present disclosure relates to a sound reproduction device and a sound reproduction system. The present disclosure particularly relates to a sound reproduction device and a sound reproduction system that can output a sound to a specific direction based on information detected by a detection device such as a sensor.

BACKGROUND ART

Patent Literature 1 (PTL 1) describes a device that intimidates an intruder when a detection device such as an infrared sensor detects the intruder who intrudes into a monitoring area where a monitoring server is disposed. The detection device is installed in a building such as a house or a storefront. PTL 1 discloses an alarm lamp, a sound warning loudspeaker, and a spray machine as an intimidating device.

This sound warning speaker enables the security device to issue a warning to an intruder in a monitoring area.

CITATION LIST

Patent Literature

1: Unexamined Japanese Patent Publication No. 2004-258937

SUMMARY OF THE INVENTION

A sound reproduction device from one aspect of the present disclosure includes a detection device that detects an object in a detecting area, and a superdirective speaker that outputs a sound. Directivity of the superdirective speaker is set for the detecting area. When the detection device detects the object in the detecting area, the superdirective speaker outputs the sound toward the detecting area.

A sound reproduction system from one aspect of the present disclosure includes a detector that detects an object in a detecting area, and a sound output unit having a superdirective speaker that outputs a sound, and a controller that controls the detector and the sound output unit. Directivity of the superdirective speaker is set for the detecting area. When the detector detects the object, the controller receives a signal from the detector. The controller controls the superdirective speaker so that the superdirective speaker outputs a sound in accordance with the signal.

A sound reproduction system from another aspect of the present disclosure includes a detector that detects an object in a detecting area, a superdirective speaker that outputs a sound, and a controller that controls the detector and the superdirective speaker. The controller determines a situation in the detecting area based on a signal detected by the detector. In a specific situation, the controller outputs a first signal to the superdirective speaker, and the superdirective speaker outputs a sound in accordance with the first signal.

DESCRIPTION OF EMBODIMENTS

A sound reproduction device and a sound reproduction system of the present disclosure will be described. In the present exemplary embodiment, security device 1 will be described as the sound reproduction device. Further, security system 100 will be described as the sound reproduction system.

First Exemplary Embodiment

Figure 1:
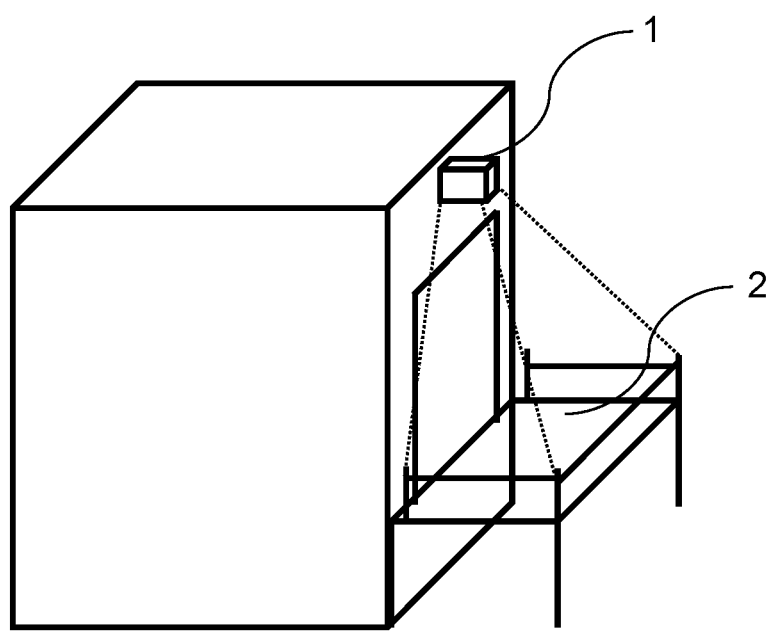
FIG. 1 is a perspective view illustrating a state that a security device according to a first exemplary embodiment is installed in a monitoring area.
Figure 2:
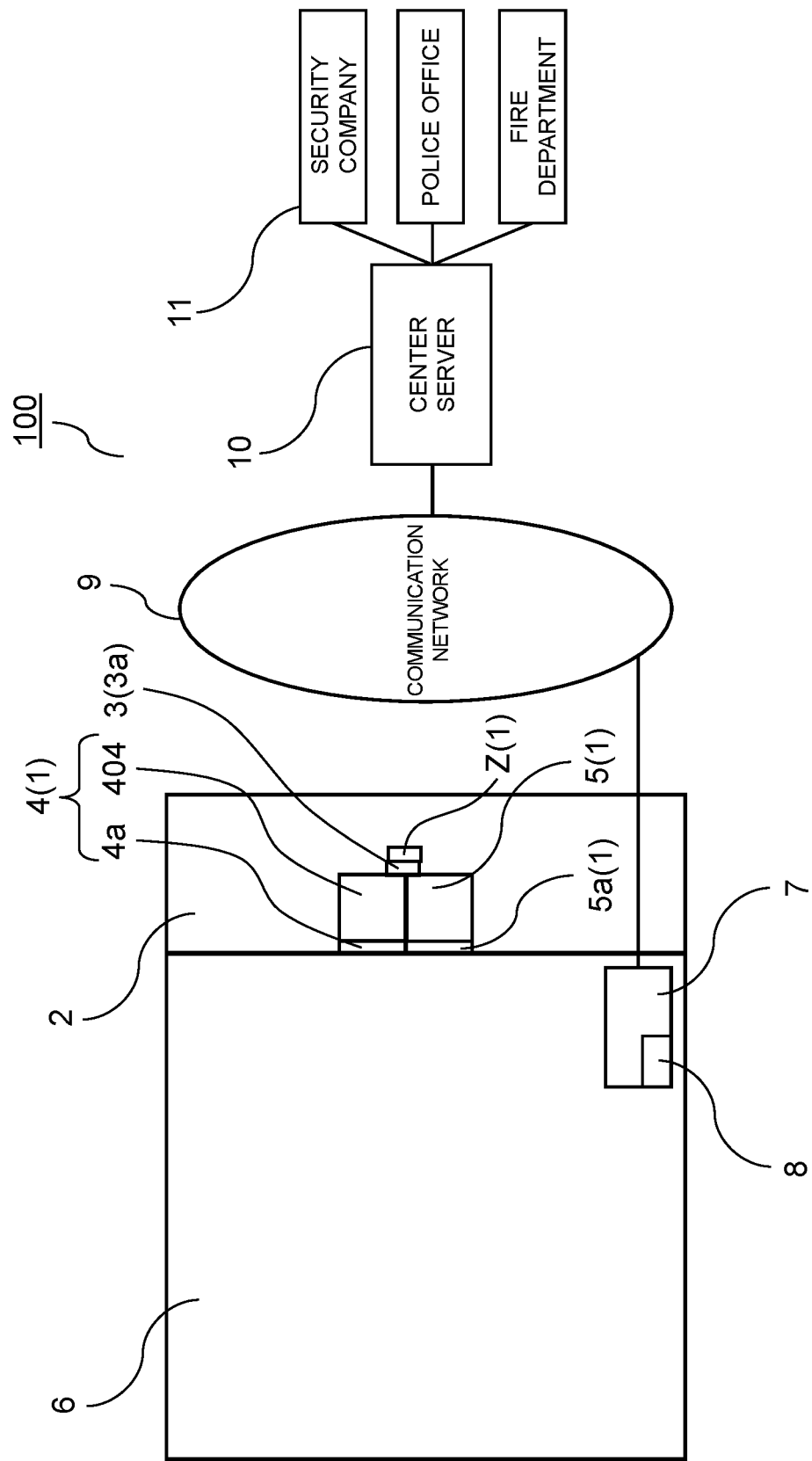
FIG. 2 is a schematic diagram illustrating a security system according to a second exemplary embodiment.

An outline of security device 1 according to a first exemplary embodiment will be described below with reference to FIG. 1 and FIG. 2. FIG. 1 is a perspective view illustrating a state where security device 100 according to the first exemplary embodiment is mounted in monitoring area 2. FIG. 2 is a schematic configuration diagram illustrating an outline of security system 100 according to the first exemplary embodiment.

Note that in the present exemplary embodiment, security device 1 and control unit 7 are referred to collectively as a security system.

As illustrated in FIG. 1, security device 1 is, for example, disposed so as to monitor monitoring area 2 such as a balcony or a wood deck that is located outside a house that is easily subject to attack from outside. The balcony or the wood deck is easily subject to security attack from an intruder (or an intruding object) or damages from birds and animals such as crows or sparrows. As illustrated in FIG. 2, security device 1 includes detection device 3 such as an infrared sensor, sound output device 4 having directivity, and monitoring camera 5. Security device 1 may further include, for example, an alarm lamp that flashes light in response to a target detected by detection device 3, microphone Z that collects a sound of the target in monitoring area 2, or another security device. In the present exemplary embodiment, an example where security device 1 includes monitoring camera 5 and microphone Z will be described. Monitoring camera 5 or microphone Z disposed in security device 1 can further heighten detection accuracy and a security level. Note that monitoring camera 5 or microphone Z is not necessarily provided, and thus security device 1 does not have to have monitoring camera 5 or microphone Z.

Security device 1 is connected to control unit 7 installed in building 6. Control unit 7 includes controller 8 that controls detection device 3, monitoring camera 5, and sound output device 4. Controller 8 enables sound output device 4 to output a sound having directivity to monitoring area 2 based on a predetermined signal from detection device 3. Note that in the present exemplary embodiment, monitoring area 2 will be described as the detecting area. As sound output device 4, a directional speaker (particularly, superdirective speaker) is preferably used. Further, as the directional speaker, an ultrasonic superdirective speaker (or referred to as a parametric loudspeaker) can be used. The ultrasonic superdirective speaker modulates a signal in an audible band using a signal in an ultrasonic band as a carrier wave and emits the modulated signal so as to be capable of reproducing a sound wave in an audible band in a specific space range. The ultrasonic superdirective speaker has a characteristic that an audible sound pressure has a peak at a predetermined distance from an installation position of a loudspeaker unit in a sound axis direction, and uses an ultrasonic wave as a carrier wave. Use of the superdirective speaker as sound output device 4 enables a warning sound to be propagated with high directivity mainly into monitoring area 2 due to propagation characteristics of the ultrasonic wave as the carrier wave. Therefore, the warning sound can be propagated selectively to an object that has intruded into a specific area, namely, monitoring area 2. Note that in the present disclosure, the object is variously described as "intruder", "intruding object", "intruding target", "target", "detecting target", and "suspicious individual".

Further, the superdirective speaker that is used as sound output device 4 can emit a sound louder in monitoring area 2 than outside monitoring area 2. Due to the use of the superdirective speaker as sound output device 4, a sound is hardly heard outside monitoring area 2. Only a much lower sound can be heard depending on settings of the superdirective speaker. Note that in the present exemplary embodiment, a space indicated by a dotted line in FIG. 1 is monitoring area 2.

An ultrasonic carrier wave to be generated from the ultrasonic superdirective speaker can be generated by applying an alternating current of a specific frequency to an ultrasonic vibrator configured by a piezoelectric body. Note that in the first exemplary embodiment, the ultrasonic superdirective speaker is described as a specific example of sound output device 4, but any directional speaker that is not an ultrasonic type speaker may be used. Thus, a plate-shaped directional speaker, for example, may be used.

Figure 3:
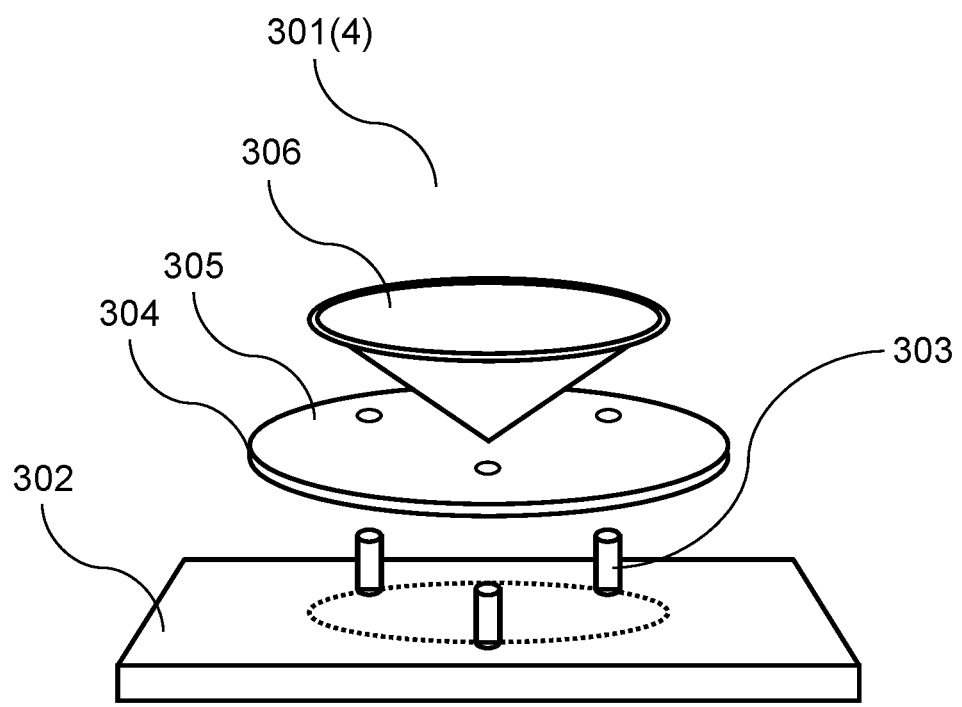
FIG. 3 is a perspective view illustrating one example of an ultrasonic actuator to be used in a superdirective speaker according to the first exemplary embodiment.
Figure 4:
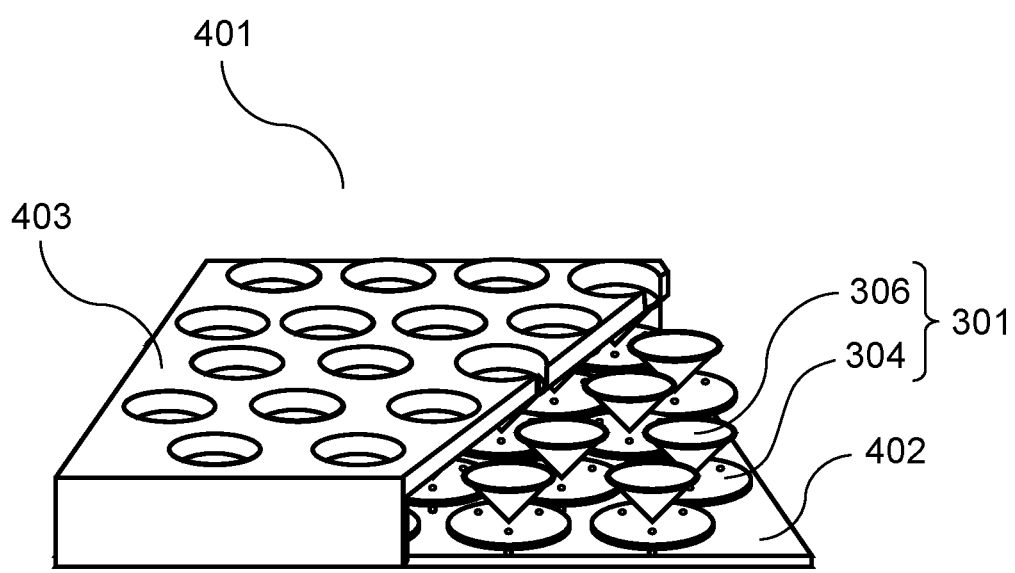
FIG. 4 is a perspective view illustrating one example of the superdirective speaker according to the first exemplary embodiment.
Figure 5:
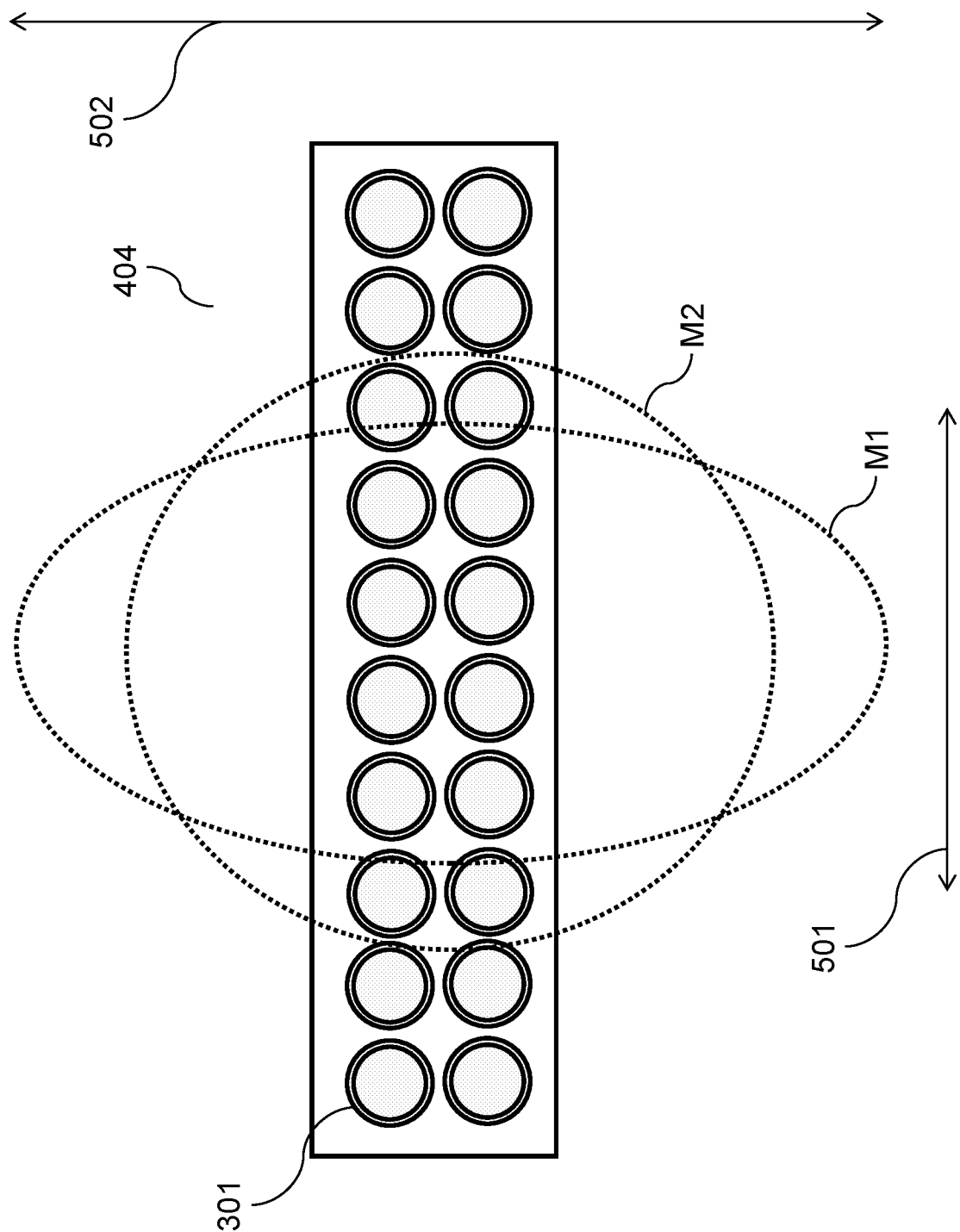
FIG. 5 is a plan view illustrating another example of the superdirective speaker according to the first exemplary embodiment.

A case where the ultrasonic superdirective speaker is used as sound output device 4 will be described in detail below with reference to FIG. 3, FIG. 4, and FIG. 5. FIG. 3 is a perspective view illustrating one example of ultrasonic actuator 301 to be used in the superdirective speaker according to the first exemplary embodiment. FIG. 4 illustrates one example of the superdirective speaker configured by arranging ultrasonic actuators 301 into an array form in the first exemplary embodiment. Note that in FIG. 4, cover 403 is partially fractured in order to make a configuration of actuator array 401 be easily understood. FIG. 5 illustrates an example of superdirective speaker 404 configured by arranging the ultrasonic actuators into a horizontally long array pattern in the first exemplary embodiment.

In FIG. 3, ultrasonic actuator 301 has a plurality of supporting columns 303 for power feeding provided on base 302. Supporting columns 303 support diaphragm 305. Piezoelectric element 304 is disposed on a rear surface of the diaphragm 305. Further, supporting columns 303 feed electric powers to piezoelectric element 304. Cone 306 is disposed on diaphragm 305. Piezoelectric element 304 disposed in ultrasonic actuator 301 is vibrated by a signal transmitted from a power amplifier (not illustrated), so that a sound wave is emitted to a medium such as air according to the signal. The sound wave to be emitted has a frequency of a carrier signal, and is an ultrasonic wave having a frequency higher than a highest frequency in the audible band. The audible band is about 20 Hz to 20 kHz. The carrier signal is an ultrasonic wave having a frequency of an ultrasonic band higher than 20 kHz.

In FIG. 4, actuator array 401 has an array structure in which a plurality of ultrasonic actuators 301 is arranged in parallel on substrate 402. Actuator array 401 is covered by cover 403. Fine portions including piezoelectric element 304 and cone 306 can be protected against an external force. Not that in the exemplary embodiment illustrated in FIG. 4, the plurality of ultrasonic actuators 301 is arranged into a planar shape, but the present disclosure is not limited to this arranging method. Actuator array 401 may be configured so that ultrasonic actuators 301 are arranged into any shape such as a circular shape, an oval shape, or a multangular shape.

<Superdirective Speaker 404 that is Horizontally Long>

Herein, superdirective speaker 404 that is horizontally long will be described with reference to FIG. 5.

As illustrated in FIG. 5, in superdirective speaker 404 that is horizontally long, the plurality of ultrasonic actuators 301 is arranged into a linear shape. As for superdirective speaker 404 that is horizontally long illustrated in FIG. 5, the directivity is narrow in a lateral direction (indicated by arrow 501 in FIG. 5) and is wide in a vertical direction (in FIG. 5, a direction of arrow 502). FIG. 5 illustrates a concept of the directivity of superdirective speaker 404 as area M1.

On the other hand, although not illustrated, when ultrasonic actuators 301 are arranged into a circular shape, the directivity also sharply extends into a circular shape. FIG. 5 illustrates an area concept of the directivity indicated by ultrasonic actuators 301 as area M2 in a case where ultrasonic actuators 301 are arranged into the circular shape.

As illustrated in FIG. 1, a case where a sound is emitted from security device 1 into monitoring area 2 in a direction from above to a floor will be described. In such an exemplary embodiment, it is preferable that superdirective speaker 404 which is horizontally long, described with reference to FIG. 5 is used as sound output device 4. When superdirective speaker 404 in which ultrasonic actuators 301 are arranged into a horizontally long shape illustrated in FIG. 3 is used, a sound that extends to the vertical direction (arrow 502) can be output. Horizontally long superdirective speaker 404 can aim exclusively at an intruded object. Therefore, horizontally long superdirective speaker 404 is more preferable than a superdirective speaker in which ultrasonic actuators 301 are arranged into the circular shape. Note that superdirective speaker 404 in which ultrasonic actuators 301 are arranged into the circular shape is more preferable depending on an ambient environment or an installation condition.

<Directivity of Superdirective Speaker 404>

Herein, the directivity of superdirective speaker 404 will be described below. When ultrasonic superdirective speaker 404 using ultrasonic actuators 301 superimposes an audible sound component on an ultrasonic wave to emit the obtained wave, the emitted wave is subject to non-linear effect of an air elastic characteristic. Therefore, as the audible sound component that is superimposed on the ultrasonic wave and is emitted advances in air, a waveform of the ultrasonic wave as the carrier wave is deformed and is attenuated from the ultrasonic wave component of high frequency. For this reason, as the ultrasonic wave advances in air, the audible sound component superimposed on the ultrasonic wave is reproduced. In general, as the frequency of a sound wave is higher, the sound wave propagates with less extension from a sound axis. Therefore, the emission angle becomes small and the directivity becomes high. The use of an ultrasonic wave higher in frequency than an audible sound as the carrier wave gives directivity to the propagation, and an audible sound component is reproduced during the propagation of the ultrasonic wave due to the effect of the non-linear air characteristic. As a result, a sound can be propagated selectively to a range of a predetermined emission angle. Herein, the predetermined distance at which the audible sound pressure in the superdirective speaker has a peak is, hereinafter, referred to as "sound pressure peak distance". Note that the "sound pressure peak distance" includes an error.

Figure 6A:
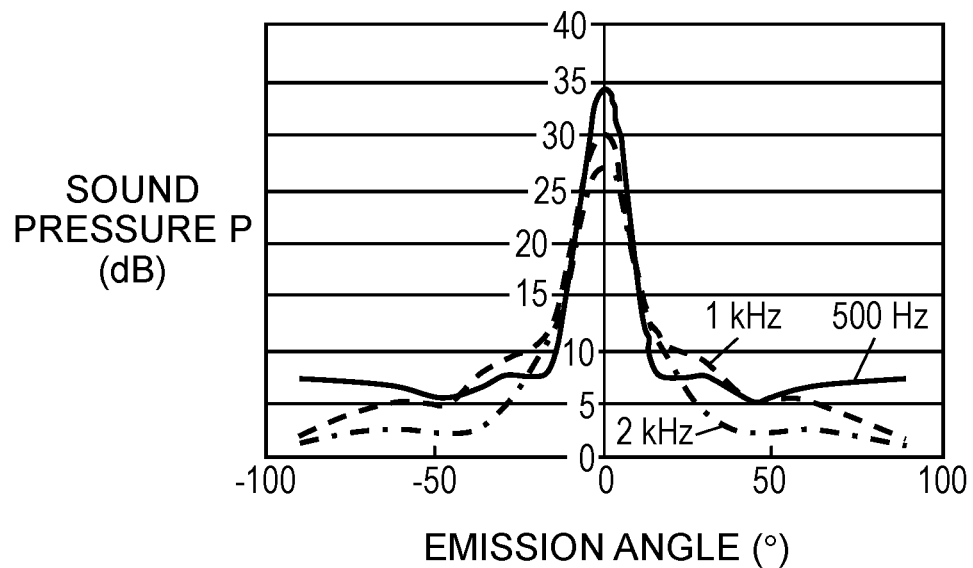
FIG. 6A is a directivity chart of the superdirective speaker.
Figure 6B:
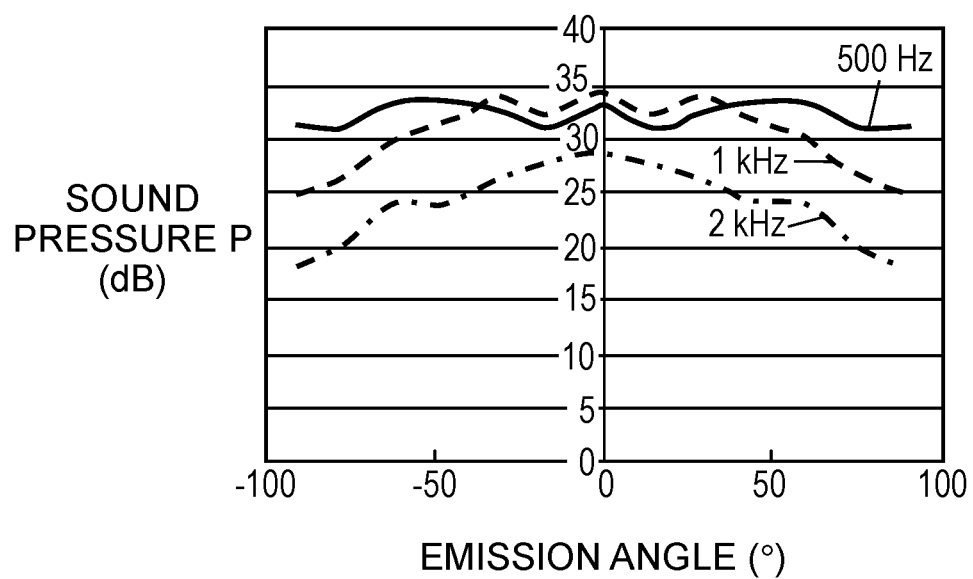
FIG. 6B is a directivity chart of a conventional loudspeaker.

FIG. 6A is a diagram illustrating directivity characteristics of an audible sound (500 Hz, 1 kHz, 2 kHz) in the ultrasonic superdirective speaker used in the present exemplary embodiment. FIG. 6B is a diagram illustrating directivity characteristics of an audible sound (500 Hz, 1 kHz, 2 kHz) in a conventional loudspeaker. Lateral axes in FIG. 6A and FIG. 6B indicate the emission angle of the directional speaker with respect to the sound axis, and vertical axes indicate a sound pressure (dB) of the audible sound. As illustrated in FIG. 6A, at any audible sound frequencies of 500 Hz (a solid line), 1 kHz (a broken line), and 2 kHz (an alternate long and short dash line), the sound pressure of the directional speaker has a peak on the sound axis at which the sound wave is emitted (the emission angle=0°). Further, the sound pressure at the respective frequencies decreases by about 20 dB at the emission angle that is around ±10° with respect to the sound axis. The sound pressure decreases by 25 dB or more in a position where the emission angle with respect to the sound axis is ±30°. When the emission angle with respect to the sound axis becomes wider, the sound pressure remains at a low level. Although the sound pressure is slightly higher in a position of ±50° than in a position of around 45°, the sound pressure is sufficiently smaller than near the sound axis. Therefore, it is effective that the emission angle indicating the directivity of the superdirective speaker is set within a range from 0° to ±50° inclusive. More preferably, it is effective that the sound pressure is set within a range from 0° to ±30° inclusive, more preferably within a range from 0° to ±10° inclusive.

On the contrary, as illustrated in FIG. 6B, the sound pressure of the conventional loudspeaker does not greatly change until the emission angle with respect to the sound axis becomes about 50°, and decreases gently at the emission angle more than or equal to 50°.

As described above, the superdirective speaker is higher in the directivity than the conventional loudspeaker. For example, when the sound peak distance from the superdirective speaker to a listener who listens to an audible sound from the superdirective speaker is 1 m, if the angle of the sound axis of ultrasonic wave emitted from the superdirective speaker shifts by 10°, the shift is about 0.17 m in a position of the listener.

An area to be detected by detection device 3 in monitoring area 2 (in the present exemplary embodiment, superdirective speaker 404) is defined as area L1, and an area where a sound to be emitted from superdirective speaker 404 used as sound output device 4 arrives is defined as area L2. Superdirective speaker 404 is set so that an area ratio between area L1 and area L2 in monitoring area 2 (detecting area) establishes a relationship: L1≥L2. In the present exemplary embodiment, superdirective speaker 404 has both functions as detection device 3 and sound output device 4. Therefore, a sound with directivity can be output to a target that intrudes into a detecting area of detection device 3 by setting an installation position of superdirective speaker 404 and by controlling a directivity angle.

That is, in a conventional detection device (for example, PTL 1), based on information detected by the detection device, a sound output unit such as a conventional loudspeaker issues only a predetermined warning to an intruder, and thus a carrier path for a sound from the loudspeaker is not taken into consideration. Therefore, a sound leakage and a noise that affect inhabitants near the monitoring area where the security device is installed cannot appropriately be controlled in some cases.

On the other hand, the sound reproduction device (security device 1) of the present disclosure can appropriately control a sound leakage and a noise that affect inhabitants near the monitoring area 2 (detecting area) and can output a sound only to a predetermined target.

Second Exemplary Embodiment

Security system 100 will be described below as a sound reproduction system of the present disclosure.

<Configuration of Security System 100>

In FIG. 2, when superdirective speaker 404 is used as sound output device 4, sound output device 4 is mechanically connected to drive unit 4a that contains a motor. Further, sound output device 4 is mounted to a case (not illustrated) via drive unit 4a. Drive unit 4a can perform a rotating operation through the motor electrically connected to controller 8. Sound output device 4 can move in an up-and-down direction and a right-and-left direction according to a control signal from controller 8 with drive unit 4a being a fixing point. Therefore, a direction of a sound wave to be emitted from superdirective speaker 404 (sound output device 4), namely, a direction of the sound axis can be optionally changed within a drivable range of drive unit 4a, and a sound can be emitted to a specific target (detected object). The sound includes a variety of sounds such as a message sound, a warning sound, and music.

Further, drive unit 4a according to the present exemplary embodiment can make a rotary motion or a turning motion through the motor. Sound output device 4 may incorporate a drive member (not illustrated) such as a linear motor that can make a linear motion or a solenoid that can make a reciprocating motion.

Note that in the following description in the present exemplary embodiment, superdirective speaker 404 and drive unit 4a will collectively be described as sound output device 4. Further, in the following description, the "direction of the superdirective speaker" is equal to the "direction of the sound axis".

In FIG. 2, an information processing device such as a computer or a terminal device can preferably be used as control unit 7. For example, a laptop computer, a notebook-type computer, or a communication terminal device such as a smartphone is used as control unit 7. As described later, a memory such as a read-only memory (ROM) or ROM is disposed in control unit 7 in advance. An operating system (OS) that controls a basic operation of control unit 7 is recorded in the ROM. Application software or the like that operates security device 1 is temporarily stored in a random-access memory (RAM). When the application software is introduced into control unit 7, an optical medium, a memory card, or the like not illustrated, is attached so that the application software is installed. Alternatively, control unit 7 is connected to a communication network such as the Internet, described later, so that the software is installed from another server. Control unit 7 includes an information receiving unit that receives information from detection device 3, a storage unit (functions also as a random-access memory (RAM)) that stores detection of an intruding object (an intruder or an intruding object), and a selection unit that selects a type of a sound to be output from sound output device 4 according to types of registered monitoring modes. Examples of the types of the monitoring modes include various modes including a normal monitoring mode in which an intruder in a monitoring area is normally monitored, a birds and animals monitoring mode in which birds and animals other than human beings are monitored, and a test mode in which the security system is checked.

<Operation of Security System 100>

One example of the operation of security system 100 will be described with reference to FIG. 2. Note that in the present exemplary embodiment, the "detecting area" is described as "monitoring area 2". For example, infrared sensor 3a or an ultrasonic wave sensor disposed in detection device 3 always monitors a state in monitoring area 2. In the monitoring state, detection device 3 transmits a detection signal to control unit 7 intermittently or continuously. In the present exemplary embodiment, a case where infrared sensor 3a is disposed in detection device 3 will be described as an example. In the monitoring state, when a detecting target intrudes into monitoring area 2, infrared sensor 3a senses temperature of a human being. As a result, a waveform of an electric signal to be transmitted from infrared sensor 3a is different from a waveform of a normal signal at a time when there is no human being. Control unit 7 detects abnormality of the waveform of the electric signal transmitted from infrared sensor 3a, and thus recognizes that abnormality occurs in monitoring area 2.

Further, when, instead of infrared sensor 3a, the ultrasonic wave sensor (not illustrated) is disposed in detection device 3, the ultrasonic wave sensor captures a reflection wave of the ultrasonic wave from another device or the like, and converts the reflection wave into an electric signal. When a suspicious individual (or a suspicious object) intrudes into monitoring area 2, intrusion by a detecting target disturbs the reflection wave of the ultrasonic wave. Thus, a waveform of the signal to be transmitted from the ultrasonic wave sensor is different from a waveform before the intrusion of the detecting target. Control unit 7 detects abnormality of the waveform of the electric signal transmitted from the ultrasonic wave sensor, and thus recognizes that abnormality occurs in monitoring area 2.

Note that in the present exemplary embodiment, infrared sensor 3a is used as a sensor used in detection device 3, but as described above, the ultrasonic wave sensor may be used.

Further, in order to heighten the detection accuracy, for example, both infrared sensor 3a and the ultrasonic wave sensor may be mounted. That is, the detection accuracy can be heightened by mounting plural types of different sensors to detection device 3.

When control unit 7 determines, based on a detection signal from detection device 3, that a state is different from a normal state, control unit 7 transmits an emission signal for emission of a sound to sound output device 4. Sound output device 4 emits a sound into monitoring area 2, based on the emission signal, through a sound output unit such as superdirective speaker 404.

When control unit 7 determines that the state returns to the normal state, based on the detection signal output from detection device 3, control unit 7 transmits a stop signal to sound output device 4. When receiving the stop signal, sound output device 4 stops the transmission of the sound from superdirective speaker 404.

As another exemplary embodiment, after control unit 7 transmits the emission signal to sound output device 4, control unit 7 causes a display device (not illustrated) disposed in control unit 7 or a display device (not illustrated) connected to control unit 7 to show display representing abnormality in monitoring area 2. Further, control unit 7 causes the display device to perform display, and for example, a buzzer (not illustrated) that outputs a warning sound is disposed so as to be capable of making a notification to a user in building 6.

The user checks a situation in monitoring area 2 according to the display on the display device or the warning sound. When the user judges that the sound emitted from sound output device 4 may be stopped, the user operates a switch (not illustrated) and the like directly disposed in control unit 7. Control unit 7 that has detected the operation of the switch and the like transmits a stop signal to sound output device 4. When receiving the stop signal, sound output device 4 causes superdirective speaker 404 to stop the sound emission.

In the present exemplary embodiment, since monitoring camera 5 is disposed, the detection accuracy of a detecting target in monitoring area 2 can be further improved. Further, since monitoring camera 5 can capture an image of monitoring area 2, the user and the like can analyze the captured image later. Thus, convenience is improved.

An exemplary embodiment that improves the detection accuracy will be described below. The image captured by monitoring camera 5 is subject to, for example, an image compressing process in monitoring camera 5. Thereafter, the image that has been subject to the image compressing process is converted into an image signal of data format to be transmitted to control unit 7. When control unit 7 determines abnormality based on the detection signal from detection device 3, control unit 7 determines a situation in monitoring area 2 using image analyzing software installed inside. That is, even in a case where control unit 7 determines abnormality based on the detection signal from detection device 3, if control unit 7 determines that there is no danger in a cause of the abnormality in the detection signal as a result of the analysis conducted in control unit 7 using the image analyzing software, the signal is not emitted to sound output device 4. The cause of the abnormality that is determined not to be a danger is, for example, small animals that hardly cause a bad effect.

Further, when the cause of the abnormality in the detection signal is, for example, a suspicious individual as the result of the analysis conducted by control unit 7 using the image analyzing software, control unit 7 immediately transmits the emission signal to sound output device 4. Sound output device 4 emits a sound mainly into monitoring area 2.

In the above exemplary embodiment, since monitoring camera 5 always captures an image and transmits an image signal to control unit 7, control unit 7 is force to bear the burden such as a signal process. Therefore, speeding-up of control unit 7 is occasionally interfered.

In order to solve this problem, in a normal state, monitoring camera 5 is brought into a state that image capturing is not performed. Control unit 7 transmits a signal to monitoring camera 5 only when detecting abnormality based on the detection signal, and instructs monitoring camera 5 to start capturing an image.

Monitoring camera 5 starts capturing an image according to the instruction from control unit 7, and executes a data process and the like to transmit an image signal to control unit 7. Control unit 7 analyzes the image using the image analyzing software and the like, and when there is no emergency, control unit 7 does not transmit an emission signal to sound output device 4. On the other hand, control unit 7 analyzes the image using the image analyzing software and the like, and when there is emergency, control unit 7 transmits an emission signal to sound output device 4. Sound output device 4 emits a sound mainly into monitoring area 2.

Further, drive unit 4a is disposed in sound output device 4 so as to be capable of moving sound output device 4. Similarly, drive unit 5a is disposed in monitoring camera 5 so as to be capable of moving monitoring camera 5. Movability of monitoring camera 5 enables a desired image capturing place to be accurately imaged. As a result, control unit 7 can improve the detection accuracy more adequately. That is, when determining abnormality based on the detection signal from detection device 3, control unit 7 performs the following control in order to accurately conduct the image analysis. In order to accurately recognize a portion that is considered to be a detecting target, control unit 7 transmits a drive signal to drive unit 5a. When drive unit 5a receives the drive signal, control unit 7 controls drive unit 5a so that the detecting target comes to a center position of the image. The above configuration enables control unit 7 to analyze the detecting target more accurately.

Further, in the present exemplary embodiment, microphone Z is disposed adjunctively. Therefore, when control unit 7 determines abnormality in the detection signal transmitted from detection device 3, microphone Z is driven to collect sounds in monitoring area 2. Control unit 7 analyzes, based on the collected sound signal from microphone Z, whether the sound is a sound generated when someone travels or a conversational sound. That is, control unit 7 determines, based on information from detection device 3 and information from microphone Z, whether a detecting target intrudes into monitoring area 2. Control unit 7 determines whether an emission signal can be output to sound output device 4, according to a determined result based on the information from microphone Z.

Further, microphone Z that is disposed can always record a sound in monitoring area 2. Therefore, security convenience can be improved.

The convenience will be described below.

Since monitoring camera 5 is disposed in the present exemplary embodiment, at least the situation in monitoring area 2 can always be recorded. Control unit 7 can later check images before and after detection of the abnormality from the detection signal on the display device (not illustrated) connected to control unit 7. For this reason, control unit 7 can check an appearance of the detecting target with a certain degree of accuracy.

Control unit 7 is further connected to center server 10 via communication network 9 such as the Internet. Center server 10 is externally installed. Information about the detecting target such as an intruder detected by detection device 3 is transmitted from control unit 7 to center server 10. Center server 10 is connected to a security device other than security device 1 via communication network 9. The other security device monitors other monitoring area. Center server 10 is connected also to external agency 11 such as a security company, a police office, or a fire department.

Center server 10 is generally operated by a management company that manages security device 1. Therefore, the management company can keep track of a faulty operation and a failure state of security device 1, and thus can demand a repair and the like from the user. Further, version update of existing application software for driving security device 1, introduction of new application software, and the like are necessary in some cases. In this case, a notification is issued from center server 10 to control unit 7. Control unit 7 that has received the notification determines necessity of the version update of existing application software or the introduction of new application software. When control unit 7 determines that the version update of existing application software or the introduction of new application software is necessary, the version update and the introduction of new application can automatically be performed between center server 10 and control unit 7 via communication network 9. The user can always use security device 1 in a satisfactory state without any trouble.

Note that in the present exemplary embodiment, control unit 7 is connected to center server 10 via communication network 9, but can be used in a stand-alone way without being connected to communication network 9. When control unit 7 is used in the stand-alone way, the version update of application software or the like is performed by using a memory card or the like, described later.

Further, in the present exemplary embodiment, control unit 7 is connected to utility power. Power from control unit 7 is commonly supplied to detection device 3, sound output device 4, drive unit 4a, monitoring camera 5, drive unit 5a, and microphone Z via an electric wire, not illustrated. Further, a data communication wire, not illustrated, is provided in control unit 7, and control unit 7 transmits and receives data to and from detection device 3, sound output device 4, drive unit 4a, monitoring camera 5, drive unit 5a, and microphone Z via the data communication wire.

Specifically, two wires including one electric wire for supplying power and one data communication wire are connected between control unit 7 and security device 1 that includes detection device 3, sound output device 4, drive unit 4a, monitoring camera 5, drive unit 5a, and microphone Z. Each of the two wires is branched in security device 1, and power is supplied to the respective units and data signals are exchanged between the respective units.

Further, as another example, control unit 7 and security device 1 are connected by using a power line communication technique, so that electric power can be supplied and a data signal can be exchanged by using one wire. At this time, control unit 7 and security device 1 needs to use electric power line communication modules, respectively.

Figure 7:
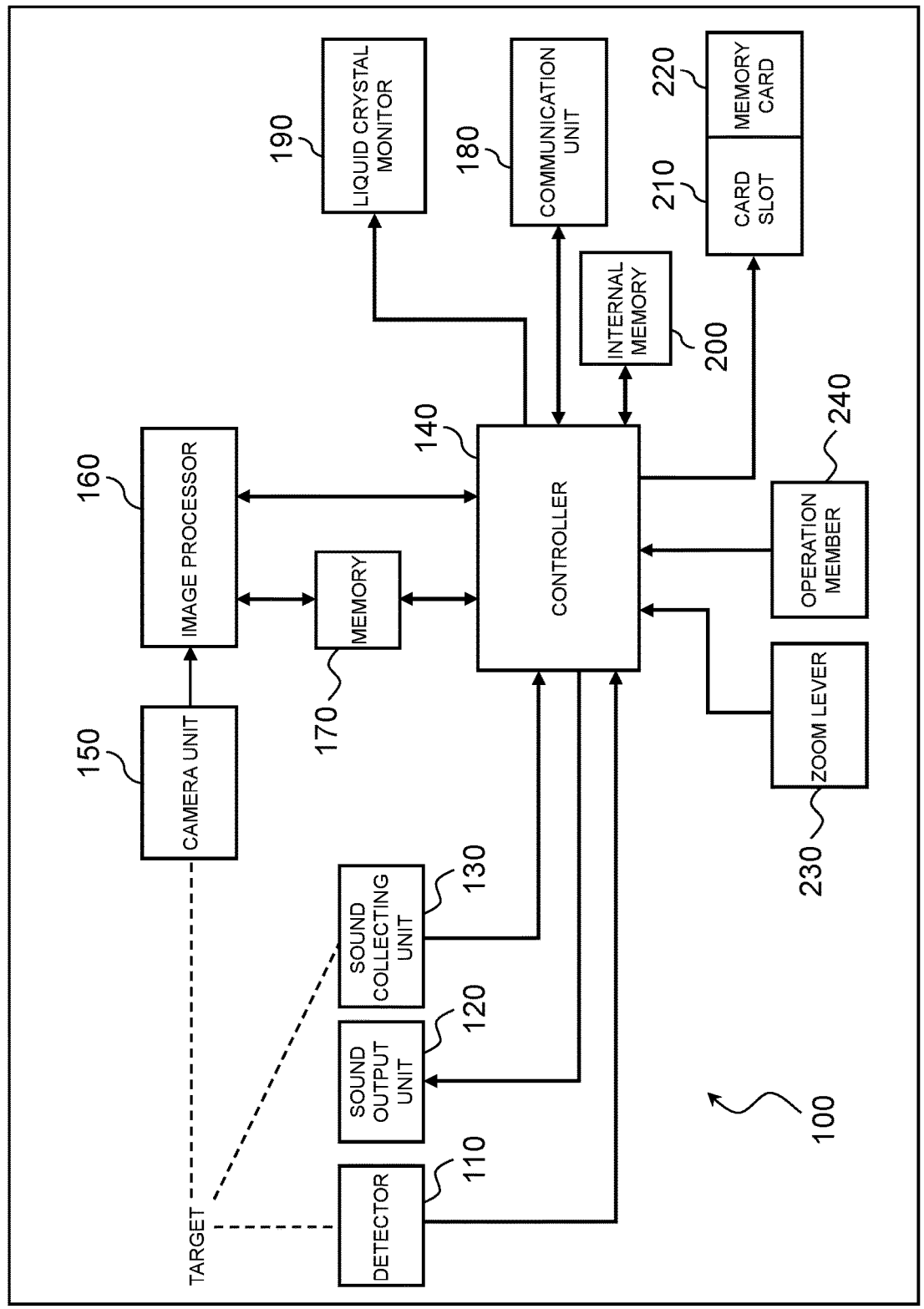
FIG. 7 is a block diagram illustrating a configuration of the security system according to the second exemplary embodiment.

An electrical configuration of security system 100 according to the present exemplary embodiment will be described with reference to FIG. 7. FIG. 7 is a block diagram illustrating a configuration of security system 100. Security system 100 includes detector 110 (corresponding to detection device 3 in FIG. 2) that is configured by a sensor such as an infrared sensor or an ultrasonic wave sensor, sound output unit 120 (corresponding to sound output device 4 in FIG. 2) that is configured by the superdirective speaker and the like, and sound collecting unit 130 (corresponding to microphone Z in FIG. 2) that is configured by a sound collecting microphone and the like. Controller 140 (corresponding to controller 8 in FIG. 2) processes a change generated in target information detected by detector 110 and in a desired range. Note that sound output unit 120 has also a function that drives drive unit 4a illustrated in FIG. 2.

Camera unit 150 includes an optical system configured by a zoom lens and the like and a charge-coupled device (CCD) image sensor that converts light into an electric signal. Camera unit 150 captures a subject image and generates video data.

Image processor 160 executes various processes on the video data generated by camera unit 150. Camera unit 150 and image processor 160 are included in monitoring camera 5 illustrated in FIG. 2. Further, image processor 160 controls also drive unit 5a that drives monitoring camera 5. Image processor 160 generates video data to be displayed on liquid crystal monitor 190, or generates video data to be stored in memory card 220. Further, image processor 160 compresses the video data generated by camera unit 150 according to, for example, a compressing format conforming to H.264 standards or Moving Picture Experts Group (MPEG) 2 standards. Further, image processor 160 decodes the compressed video data. Image processor 160 can be realized by a digital signal processor (DSP) or a microprocessor, for example.

Controller 140 (corresponding to controller 8 in FIG. 2) is a controller that performs total control. Controller 140 can be realized by a semiconductor element, for example. Controller 140 may be configured only by hardware, or may be realized by combining hardware and software. Controller 140 can be realized by a microprocessor, for example.

Memory 170 functions as a working memory of image processor 160 and controller 140. Memory 170 can be realized by, for example, a dynamic random-access memory (DRAM) or a ferroelectric memory.

A video based on video data generated by camera unit 150 and image processor 160 or a video based on video data read from memory card 220 can be displayed on liquid crystal monitor 190. At this time, when a video is displayed on liquid crystal monitor 190, controller 140 controls respective video data to display the video on liquid crystal monitor 190. In the present exemplary embodiment, liquid crystal monitor 190 is used as the display unit, but an organic electroluminescence (EL) display, an inorganic EL display, or light-emitting diode (LED) display in which a lot of LEDs are arranged may be used. Although not illustrated in FIG. 2, liquid crystal monitor 190 is disposed integrally with control unit 7, or is connected to control unit 7 by a signal line or the like.

Internal memory 200 is configured by a flash memory or a ferroelectric memory, for example. For example, internal memory 200 stores a control program for totally controlling security system 100. At this time, internal memory 200 may be two regions, namely, a ROM in which an OS and the like that realizes a basic operation of controller 140 is recorded, and a RAM in which application software and the like is recorded.

Memory card 220 is detachable from card slot 210. Card slot 210 can be mechanically and electrically connected to memory card 220. Memory card 220 includes a flash memory and a ferroelectric memory, and can store data. For example, memory card 220 can be used, as described above, when image data generated by image processor 160 is recorded, a version of the application software recorded in the RAM portion of internal memory 200 is updated, or new application software is introduced.

Zoom lever 230 is a member that receives an instruction for changing zoom magnification from a user. Operation member 240 is a member that receives an operation from the user. As operation member 240, a keyboard, a touch panel, a mouse, and the like are preferably used.

Further, communication unit 180 is used as an interface that realizes data communication between communication network 9 and control unit 7 illustrated in FIG. 2, or is used as an interface that performs data communication between security device 1 illustrated in FIG. 1 and control unit 7. Communication unit 180 is described as one communication unit 180 in the present exemplary embodiment, but as described above, communication unit 180 for communication network 9 and the communication unit for security device 1 may be disposed separately.

Further, communication unit 180 can be used appropriately according to situations such as wired communication and wireless communication. For example, when infrastructure of communication network 9 such as the Internet is provided in building 6 illustrated in FIG. 2, communication network 9 and communication unit 180 are connected by a wire so as to communicate with each other. Since security device 1 is installed outside, security device 1 and communication unit 180 are wirelessly connected so as to communicate with each other. When security device 1 and communication unit 180 wirelessly communicate with each other, wireless communication modules are necessarily disposed in communication unit 180 and security device 1, respectively.

Hereinafter, relationships between control unit 7 illustrated in FIG. 2 and respective units illustrated in FIG. 7 will be described.

Basically, since a notebook type personal computer is often used as control unit 7, control unit 7 often includes controller 140, memory 170, communication unit 180, liquid crystal monitor 190, internal memory 200, card slot 210, and operation member 240.

Control unit 7 may include at least controller 140. Whether the other units are included in control unit 7 can appropriately be changed according to an environment of the security system and a device to be used as control unit 7.

<Basic Operation of Security System 100>

Figure 8:
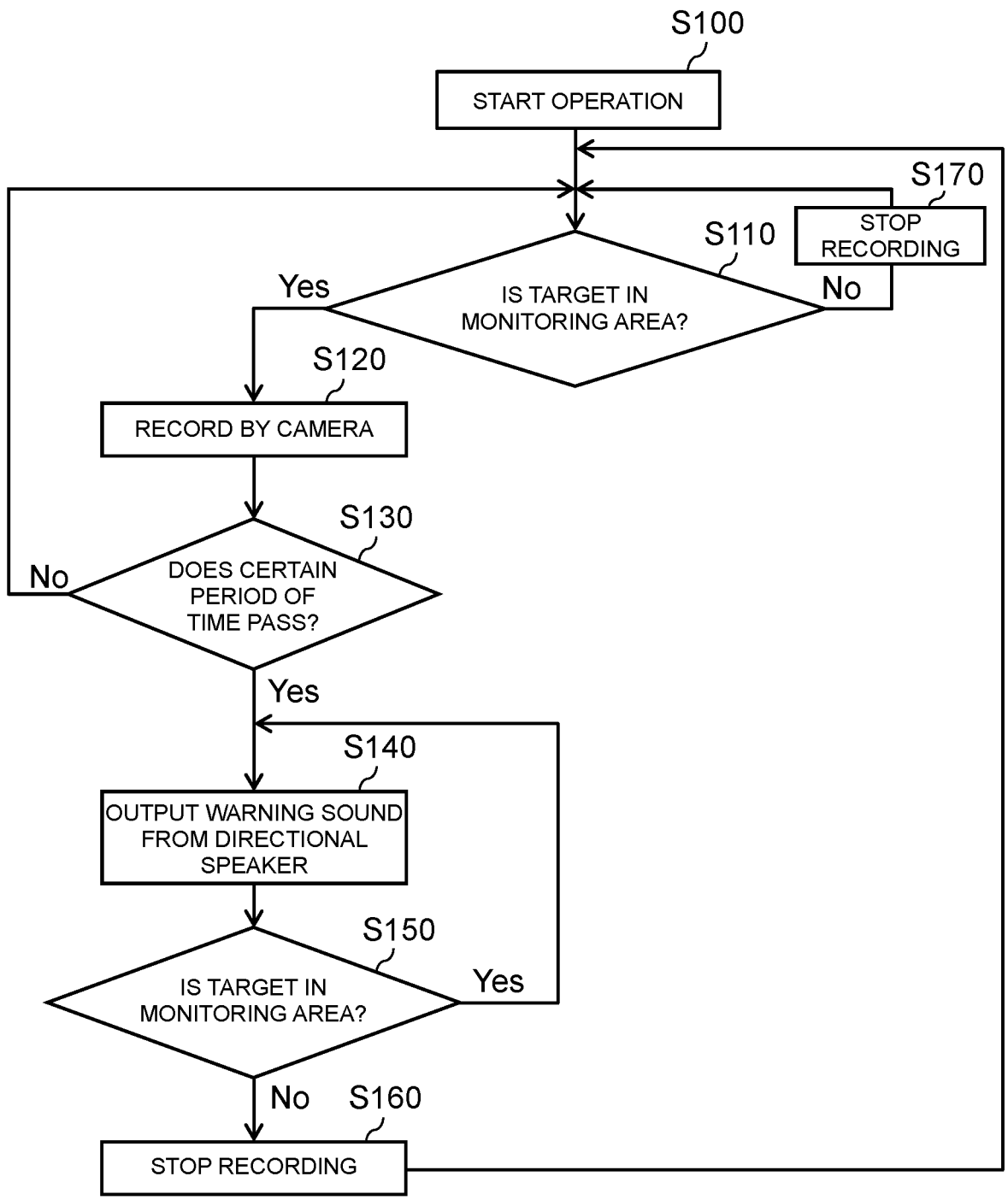
FIG. 8 is a flowchart describing the security system according to the second exemplary embodiment.

One example of a basic operation of security system 100 will be described with reference to FIG. 7 and FIG. 8. FIG. 8 is a flowchart describing the basic operation of security system 100.

Security system 100 first receives an instruction for activating the system from operation member 240 operated by the user. As a result, controller 140 checks the respective units to determine whether the respective units operate normally. At this time, controller 140 causes liquid crystal monitor 190 to display a normal surveillance system. Further, when abnormality occurs in any unit, controller 140 causes liquid crystal monitor 190 to display an abnormal portion or the like or to display that the system cannot be activated. When the system operates normally, controller 140 transmits an instruction signal to camera unit 150 and image processor 160 so that acquisition of video data is started (S100). When the acquisition of video data is started, controller 140 determines whether an intruding target is in monitoring area 2 (S110). Specifically, controller 140 determines, based on a detection signal transmitted from detector 110, whether the intruding target intrudes into monitoring area 2.

If controller 140 determines, based on the detection signal transmitted from detector 110, that the intruding target is in monitoring area 2, controller 140 starts recording video data which is being acquired into memory 170 (S120). Specifically, image processor 160 generates video data based on a video signal acquired by camera unit 150, and compresses the generated image data. Controller 140 records the compressed image data in memory 170.

If starting to record the video data in memory 170, controller 140 determines, using a timer of controller 140 and the like, whether a certain period of time passes (S130). Basically, the certain period of time is determined based on a predetermined time or a time optionally input from the user through operation member 240. The certain period of time is preferably determined between 30 seconds and 5 minutes. In the present exemplary embodiment, the certain period of time is 3 minutes. In step S130, if the certain period of time, namely, 3 minutes does not pass, the process returns to step S110. If controller 140 determines, based on the detection signal from detector 110, that the target is in monitoring area 2, controller 140 continues to record image data in memory 170 (S120), and determines in step S130 whether the certain period of time passes. Herein, if controller 140 determines, in step S110 that the target is not in monitoring area 2, controller 140 performs, in step S170, control so that memory 170 stops the recording of the image data.

After the certain period of time, namely, 3 minutes passes in step S130, controller 140 can determine the situation of the monitoring area 2 that a suspicious individual intrudes into monitoring area 2. For this reason, controller 140 transmits an emission signal to sound output unit 120, and the directional speaker outputs a warning sound (S140).

After the directional speaker outputs the warning sound, controller 140 determines whether the intruding target is in monitoring area 2 (S150). Specifically, controller 140 determines, based on a detection signal transmitted from detector 110, whether the intruding target intrudes into monitoring area 2. If, in step S150, controller 140 determines, based on the detection signal from detector 110, that the target is in monitoring area 2, the process returns to step S140, and causes the directional speaker to continuously output the warning sound.

Further, if in step S150, controller 140 determines, based on the detection signal from detector 110, that no target is in monitoring area 2, controller 140 transmits a signal for stopping the warning sound to sound output unit 120 so as to cause the directional speaker to stop emission of the warning sound. Further, controller 140 stops the recording of the video data generated and compressed by camera unit 150 and image processor 160 into memory 170 (S160). Thereafter, the process returns to step S110 and is brought into a standby state that the determination is made whether a target exists in monitoring area 2.

If, in a state that the certain period of time does not yet pass and the process returns to step S110, controller 140 determines in step S130, based on the detection signal transmitted from detector 110, that the detecting target does not intrude into monitoring area 2, controller 140 stops the recording of image data in memory 170 in S170. Thereafter, the process is again in the standby state that the determination is made whether a target intrudes into monitoring area 2.

Like the above-described example, the image data captured by the camera unit can be first recorded in memory 170 only when a detecting target intrudes into monitoring area 2. For this reason, storage capacity required by memory 170 can be suppressed. Therefore, security system 100 can employ memory 170 having small storage capacity.

Further, when the system is powered off, controller 140 detects presence/non-presence of image data stored in memory 170 and checks whether memory card 220 is inserted into card slot 210. If image data is recorded in memory 170 and memory card 220 is inserted into card slot 210, controller 140 copies the image data in memory 170 into memory card 220, and deletes the image data recorded in memory 170. In such a configuration, memory 170 is periodically refreshed so as to be capable of being prevented from overflowing during the operation of the security system.

In the present exemplary embodiment, when the system is powered off, the copying is performed for memory 170. Alternately, image data in memory 170 can be copied into memory card 220, for example, every 24 hours by using the timer of controller 140.

As described above, the security system according to the present exemplary embodiment includes at least detection device 3 that detects a target that intrudes into certain monitoring area 2, and sound output device 4 having directivity. When detection device 3 detects an intruding target, sound output device 4 outputs a sound preset for monitoring area 2. At this time, since a loudspeaker having extremely high directivity such as the ultrasonic superdirective speaker is used as sound output device 4, sound output device 4 can output a warning precisely to a suspicious object such as an intruder or a small animal, based on information detected by detection device 3. As a result, a sound leakage and a noise that affect inhabitants near an area where the security system is installed can appropriately be controlled. Therefore, for example, a noise problem due to a warning sound can be prevented from arising. At the same time, security equivalent to conventional security can be provided to a house into which security system 100 is introduced. Further, addition of monitoring camera 5 can improve detection accuracy due to the combination of monitoring camera 5 and detection device 3. Therefore, an accurate security system that rarely performs a misoperation can be provided.

The superdirective speaker according to another exemplary embodiment to be used in sound output device 4 of the security system of the present disclosure will be described below with reference to FIG. 9A and FIG. 9B.

Figure 9A:
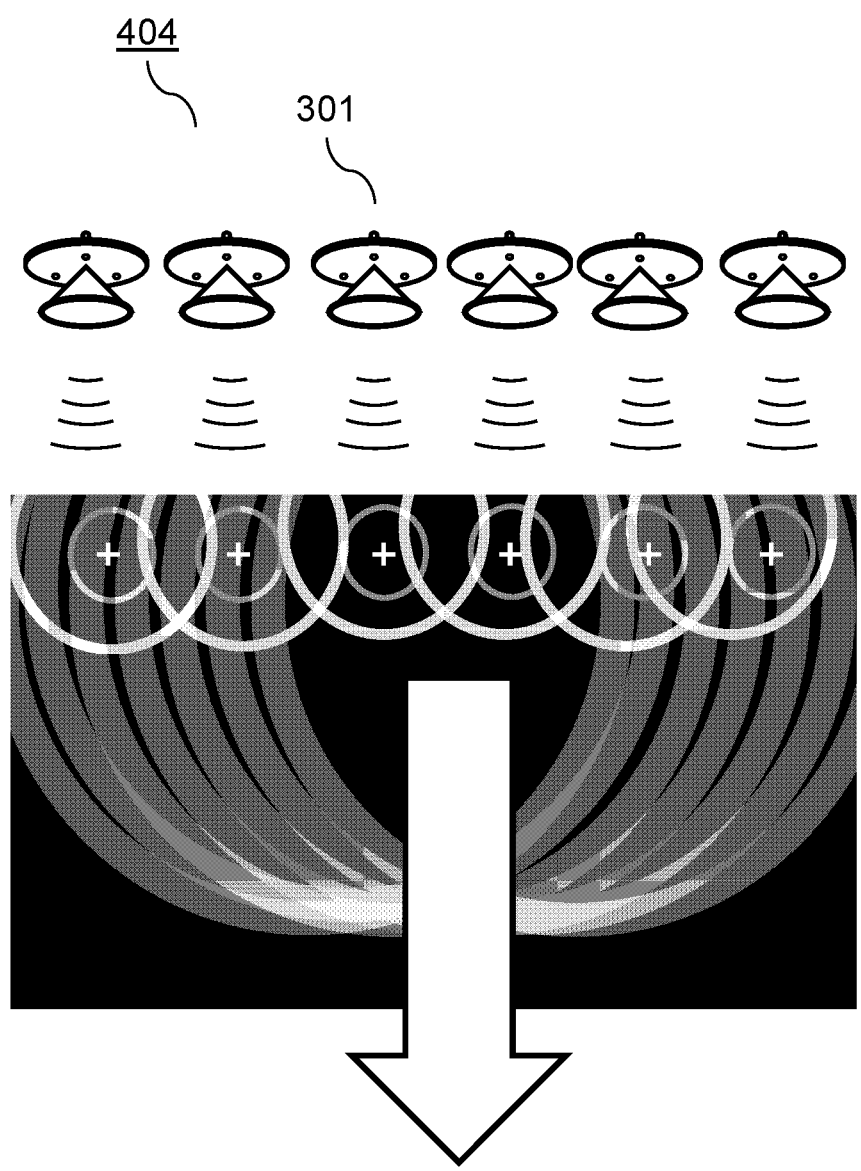
FIG. 9A is a conceptual diagram illustrating directivity of a normal sound mode of the security system according to the second exemplary embodiment.

FIG. 9A is a conceptual diagram illustrating directivity of a normal sound mode of superdirective speaker 404 to be used in security system 100 according to one exemplary embodiment of the present disclosure. FIG. 9B is a conceptual diagram illustrating directivity of a chasing sound mode of superdirective speaker 404 to be used in security system 100 according to one exemplary embodiment of the present disclosure. Like symbols are given to portions equal in configurations to the portions of security system 100 described in the first exemplary embodiment, and detailed description thereof will be omitted.

FIG. 9A illustrates a case where superdirective speaker 404 is set into the normal sound mode. The plurality of ultrasonic actuators 301 are arranged linearly. The respective ultrasonic actuators 301 modulate signals in an audible band at the same time using a signal in an ultrasonic band as a carrier wave to emit the modulated signals. As a result, superdirective speaker 404 emits a sound with directivity to a direction indicated by an arrow of FIG. 9A. In this case, as described with reference to FIG. 5, the directivity of ultrasonic actuators 301 is narrow in a lateral direction (a direction of arrow 501 in FIG. 5) and is extended in a vertical direction (a direction of arrow 502 in FIG. 5).

Figure 9B:
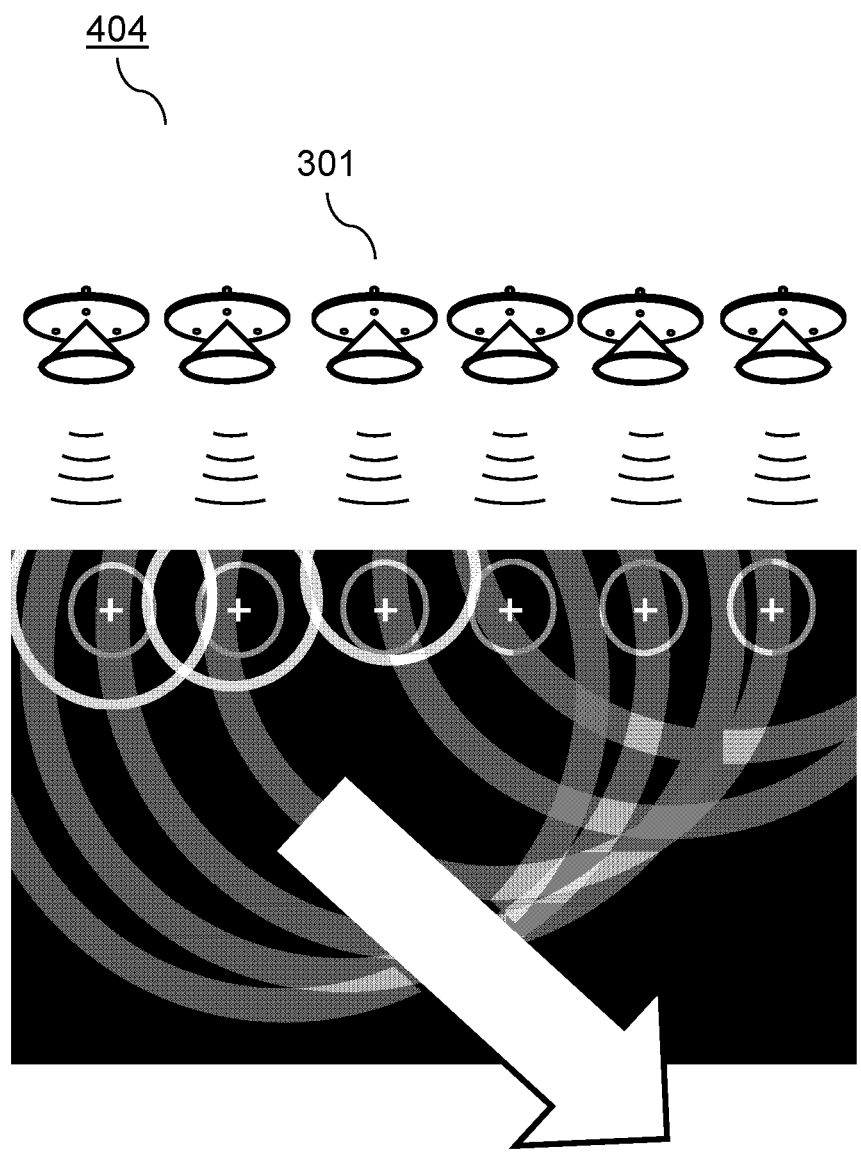
FIG. 9B is a conceptual diagram illustrating directivity of a chasing sound mode of the security system according to the second exemplary embodiment.

FIG. 9B illustrates a case where superdirective speaker 404 is set into the chasing sound mode. That is, the plurality of ultrasonic actuators 301 are arranged linearly. Ultrasonic actuators 301 modulate signals in an audible band, respectively, at gradually different times using a signal in an ultrasonic band as a carrier wave, and emit the modulated signals. As a result, superdirective speaker 404 emits a sound with directivity to a direction indicated by an arrow of FIG. 9B. The different times enable an orientation of the directivity to be changed (this function is referred to as a "chasing sound function").

When the orientation of the directivity of sound output device 4 can be changed, in the first exemplary embodiment, drive unit 4a that contains a motor that drives sound output device 4 mounted with superdirective speaker 404 is not necessary. Alternatively, when ultrasonic actuators 301 can emit signal in audible band at gradually different times according to a mechanical motion of drive unit 4a, a complicated directional motion can be provided. Further, when a warning sound can be output to a target through the chasing sound function according to a motion of the object in monitoring area 2 detected by detection device 3, a more dynamic warning can be issued to the target.

Figure 10:
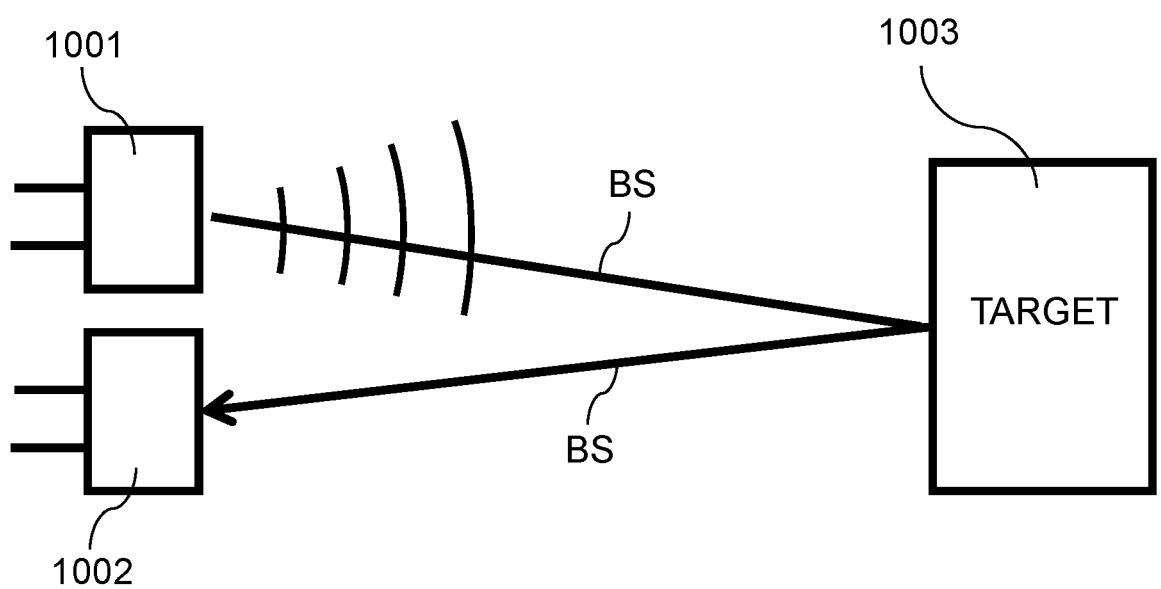
FIG. 10 is a conceptual diagram illustrating a configuration of an ultrasonic distance meter of the security system according to the second exemplary embodiment.
Figure 11:
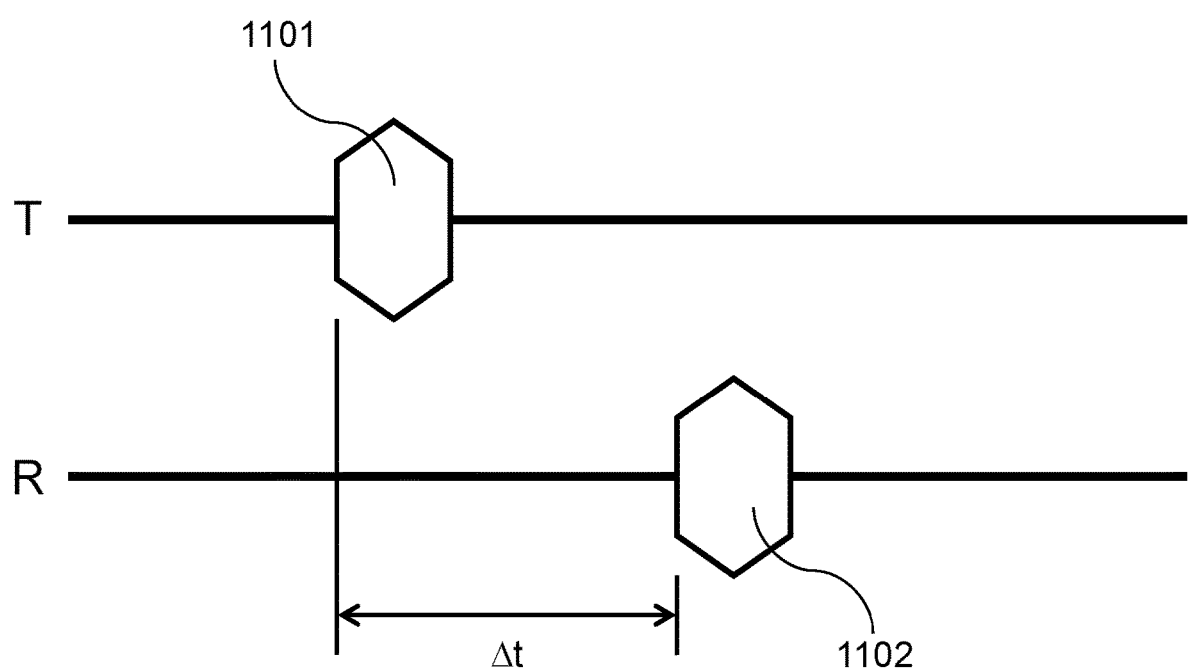
FIG. 11 is a conceptual diagram illustrating an operation of the ultrasonic distance meter of the security system according to the second exemplary embodiment.

Further, in the first exemplary embodiment, detection device 3 is additionally disposed so as to detect a detecting target in monitoring area 2. However, as described below, an ultrasonic wave output from the superdirective speaker used in sound output device 4 is used to function as detection device 3. In such a manner, detection device 3 can be omitted. FIG. 10 is a conceptual diagram illustrating a configuration of an ultrasonic distance meter of security system 100 according to one exemplary embodiment of the present disclosure. FIG. 11 is a conceptual diagram illustrating an operation of the ultrasonic distance meter of security system 100 according to the exemplary embodiment of the present disclosure. Like symbols are given to portions equal in configurations to the portions of security system 100 described in the second exemplary embodiment, and detailed description thereof will be omitted. This security system is different from the security system according to the above exemplary embodiment in that ultrasonic actuators 301 function also as detection device 3.

In FIG. 10, in security device 1 (see FIG. 2), a specific ultrasonic actuator in ultrasonic actuators 301 is set as transmitter 1001, and another ultrasonic actuator is set as receiver 1002. Transmitter 1001 outputs only burst wave BS without an audible wave to monitoring area 2. When target 1003 exists in monitoring area 2, burst wave BS transmitted from transmitter 1001 is reflected from target 1003, and is received by receiver 1002.

In FIG. 11, control unit 7 (illustrated in FIG. 2) calculates a distance from ultrasonic actuator 301 to target 1003 based on difference Δt between transmission time 1101 of burst wave BS output from transmitter 1001 and reception time 1102 of burst wave BS received by receiver 1002. Note that in FIG. 11, "T" represents burst wave BS transmitted from transmitter 1001, and "R" represents burst wave BS received by receiver 1002.

Security system 100 according to the present exemplary embodiment does not need detection device 3 such as an infrared sensor, and superdirective speaker 404 to be used in sound output device 4 functions as detection device 3. Superdirective speaker 404 that has detected target 1003 from burst wave BS can output a warning sound and the like directly and more accurately to target 1003.

A sound leakage and a noise that affect inhabitants near the area where security system 100 is installed can appropriately be controlled. Further, since detection device 3 does not have to be additionally used, security system 100 is advantageous in cost.

Note that burst wave BS transmitted from transmitter 1001 is an ultrasonic wave, and its frequency may be different from a frequency of an ultrasonic wave when sound output device 4 carries an audible wave. As a result, security system 100 has an effect that interference between the frequencies is prevented and the carrying function is independent from the detection function.

That is, herein, superdirective speaker 404 has the function of the detector (detection device 3). Frequency F1 of the ultrasonic wave with which the audible wave is carried when superdirective speaker 404 functions as the loudspeaker may be made to be different from frequency F2 of the ultrasonic wave with which target 103 is detected when superdirective speaker 404 functions as the detector (detection device 3) (namely, frequency F1≠frequency F2). As a result, interference between frequency F2 and frequency F1 can be prevented. Therefore, mixing of a noise into a sound to be output from superdirective speaker 404 can be suppressed, and deterioration in the detection accuracy of the detector (detection device 3) can be suppressed. Note that when frequency F2 is made to be lower than frequency F1, frequency F2 gets close to an audible frequency band, and this causes generation of an uncomfortable sound. Therefore, it is desirable that frequency F2>frequency F1.

Various forms of security system 100 will be described below. FIG. 12 to FIG. 16 are block diagrams illustrating security system 100 in modifications of the security system of the present disclosure.

<First Modification of Security System 100>

Figure 12:
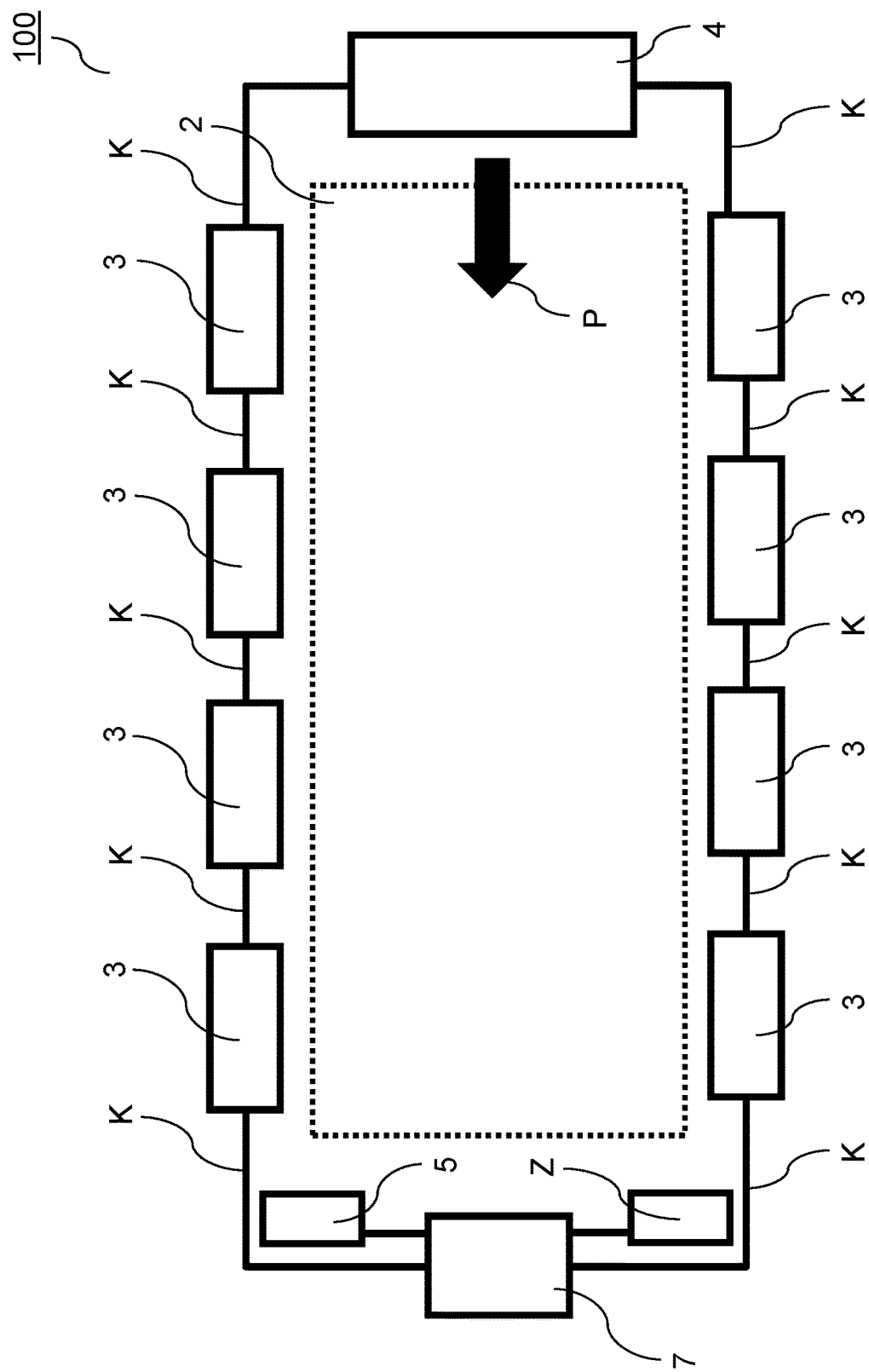
FIG. 12 is a block diagram illustrating the security system according to a first modification of the present disclosure.

Security system 100 illustrated in FIG. 12 is effective for a case where an area of monitoring area 2 is comparatively large or a case where an obstacle such as a wall exists in monitoring area 2. In the modification illustrated in FIG. 12, eight detection devices 3 are disposed, and one sound output device 4 is disposed. In such a manner, intrusion of a detecting target and the like can be more accurately kept track of throughout monitoring area 2 by disposing a lot of detection devices 3, and thus a security level can be heightened. That is, even when the area of monitoring area 2 is large or an obstacle exists in monitoring area 2, the intrusion of a detecting target can be detected comparatively throughout the entire area. Therefore, a blind spot in the monitoring range can be reduced.

An operation of security system 100 according to a first modification will be described below. Note that since the detailed operation is described above with reference to FIG. 1 to FIG. 11, the outline will be described. When the plurality of detection devices 3 sense that a suspicious body intrudes into monitoring area 2, control unit 7 causes sound output device 4 to output a sound into monitoring area 2. More precise information about the detecting target is acquired by using monitoring camera 5 or microphone Z. Note that monitoring camera 5 and microphone Z are disposed optionally and thus they are not essential members. Control unit 7 is connected in series to the respective members (sound output device 4, detection devices 3, and the like) by cable K as illustrated in FIG. 12. Cable K is a wire through which electric power and a signal pass. Use of cable K that connects control unit 7 and the respective members secures exchange of signals between the respective members and control unit 7, and thus a stable operation can be realized. Note that in the present modification, control unit 7 and the respective members (detection devices 3 and sound output device 4) are connected in series. However, the respective members may be connected in parallel to control unit 7. Further, in the present exemplary embodiment, the respective members and control unit 7 are wiredly connected by cable K, but may be connected by wireless communication. In the case of the connection via the wireless communication, the members require wireless communication modules, respectively. In this case, when sound output device 4 or detection devices 3 are disposed, cable K is necessary. For this reason, a degree of freedom is remarkably improved. Further, when control unit 7 is connected by wireless communication, rechargeable batteries (not illustrated) have to be mounted, respectively, to the members configuring control unit 7. Note that in the present exemplary embodiment, rechargeable batteries are used in the members, respectively. However, since sound output device 4 needs a large amount of power, it is more preferable that utility power is connected to sound output device 4 instead of the rechargeable battery.

<Second Modification of Security System 100>

Figure 13:
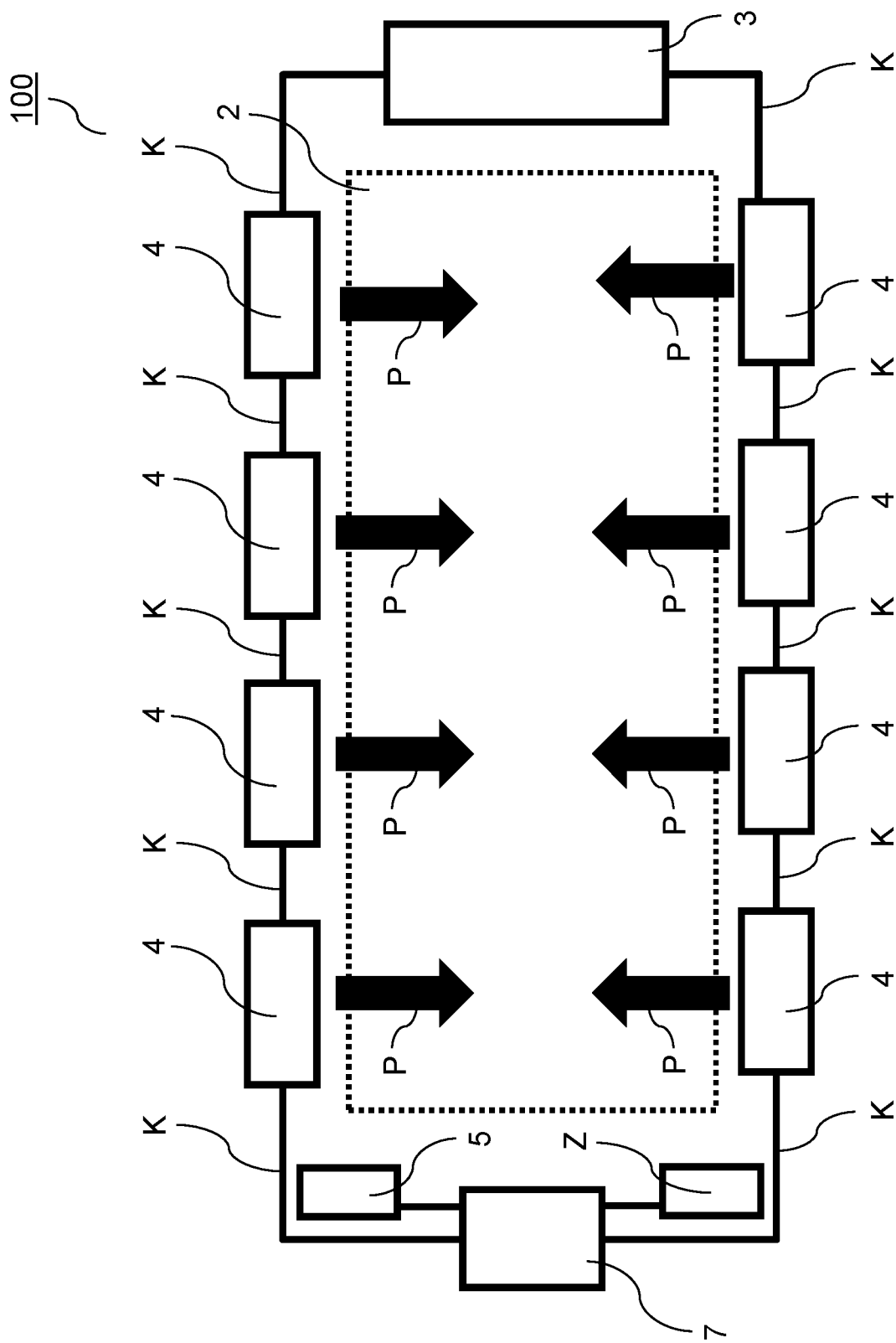
FIG. 13 is a block diagram illustrating the security system according to a second modification of the present disclosure.

Security system 100 according to a second modification will be described below with reference to FIG. 13. In security system 100 illustrated in FIG. 13, one detection device 3 is disposed, and eight sound output devices 4 are disposed. Since a basic configuration is equal to the configuration in FIG. 12, detailed description thereof will be omitted. In the configuration illustrated in FIG. 13, when detection device 3 detects a detecting target, sound output devices 4 can emit sound P throughout monitoring area 2. As a result, when the detecting target is a person, an effective warning can be issued securely to a suspicious individual.

<Third Modification of Security System 100>

Security system 100 according to a third modification will be described below with reference to FIG. 14.

Figure 14:
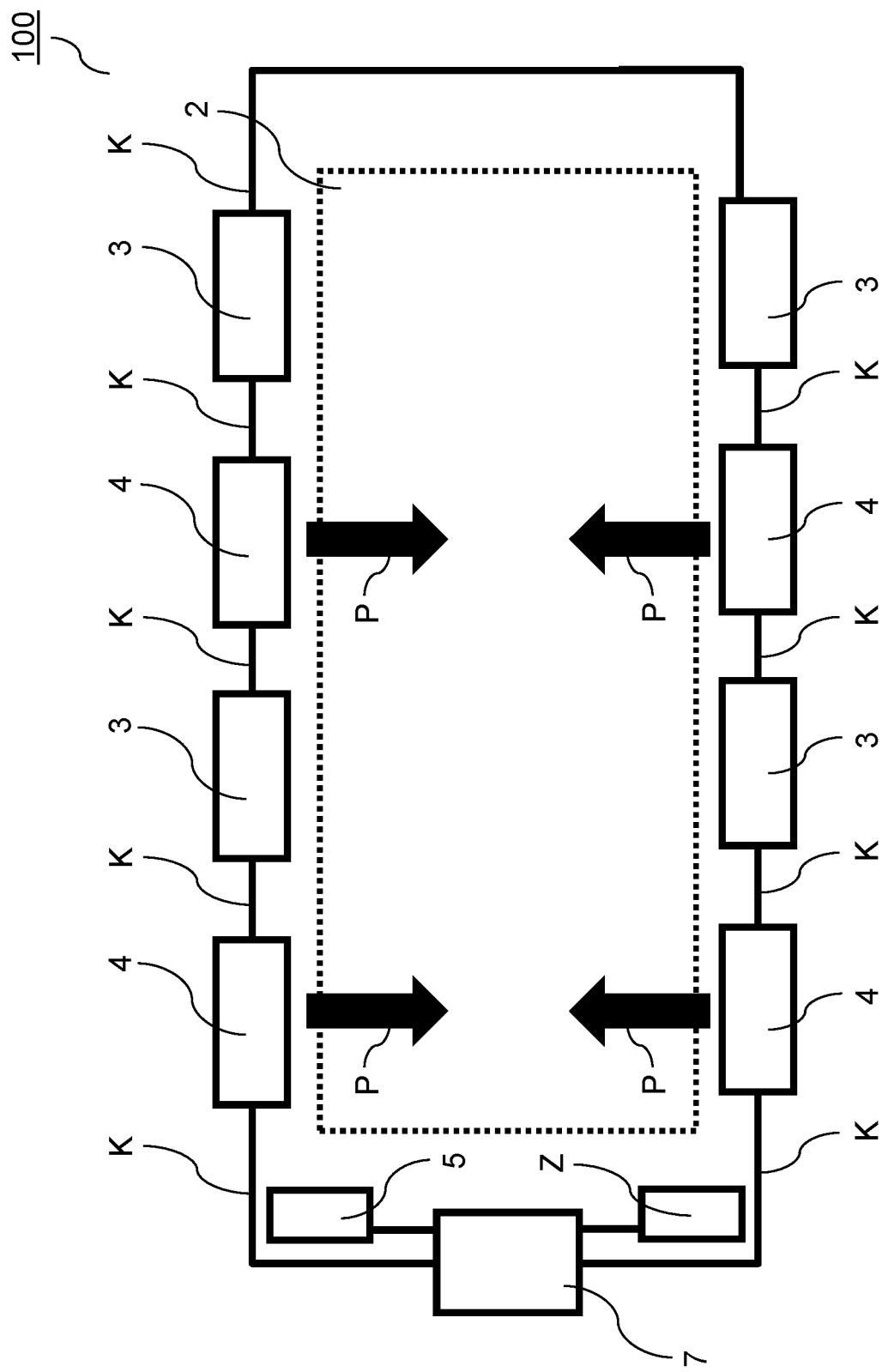
FIG. 14 is a block diagram illustrating the security system according to a third modification of the present disclosure.

In security system 100 illustrated in FIG. 14, four detection devices 3 are disposed, and four sound output devices 4 are disposed. Since a basic configuration is equal to the configuration in FIG. 12, detailed description thereof will be omitted. The configuration illustrated in FIG. 14 enables the plurality of detection devices 3 to detect a detecting target, and thus enables detection accuracy to be improved. Further, sound output devices 4 can emit sound P throughout monitoring area 2. As a result, when the detecting target is a person, an effective warning can be issued securely to a suspicious individual.

<Fourth Modification of Security System 100>

Security system 100 according to a fourth modification will be described below with reference to FIG. 15.

Figure 15:
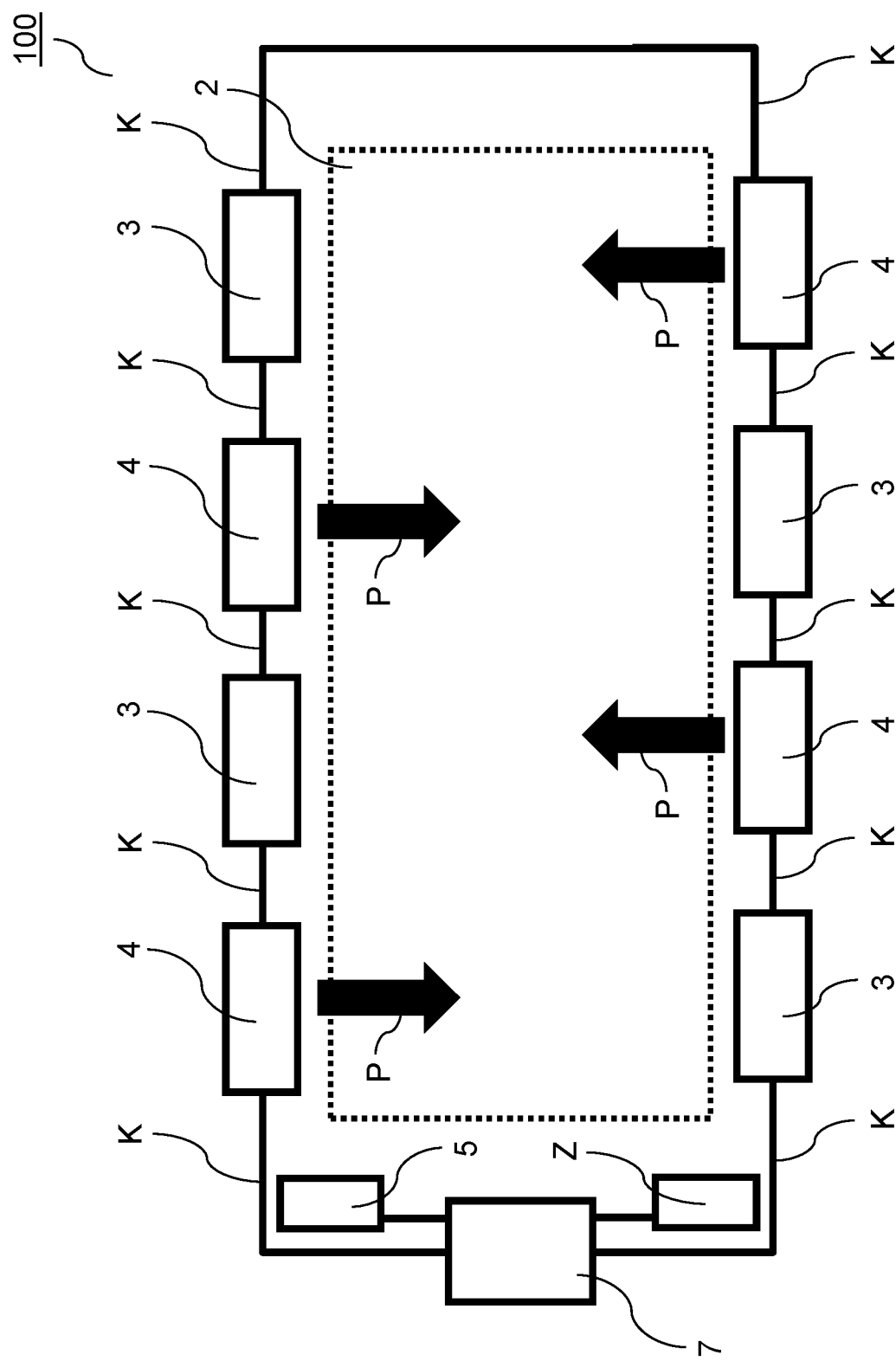
FIG. 15 is a block diagram illustrating the security system according to a fourth modification of the present disclosure.

FIG. 15 illustrates still another modification of security system 100 illustrated in FIG. 14. In security system 100 illustrated in FIG. 14, the plurality of detection devices 3 are disposed to oppose each other, and the plurality of sound output devices 4 are disposed to oppose each other. On the other hand, in security system 100 illustrated in FIG. 15, detection devices 3 and sound output devices 4 are disposed to oppose each other, respectively. In the configuration illustrated in FIG. 15, even if an obstacle such as a wall exists in monitoring area 2, the detection of a detecting target and the emission of sound P can be securely realized.

<Fifth Modification of Security System 100>

Security system 100 according to a fifth modification will be described below with reference to FIG. 16.

Figure 16:
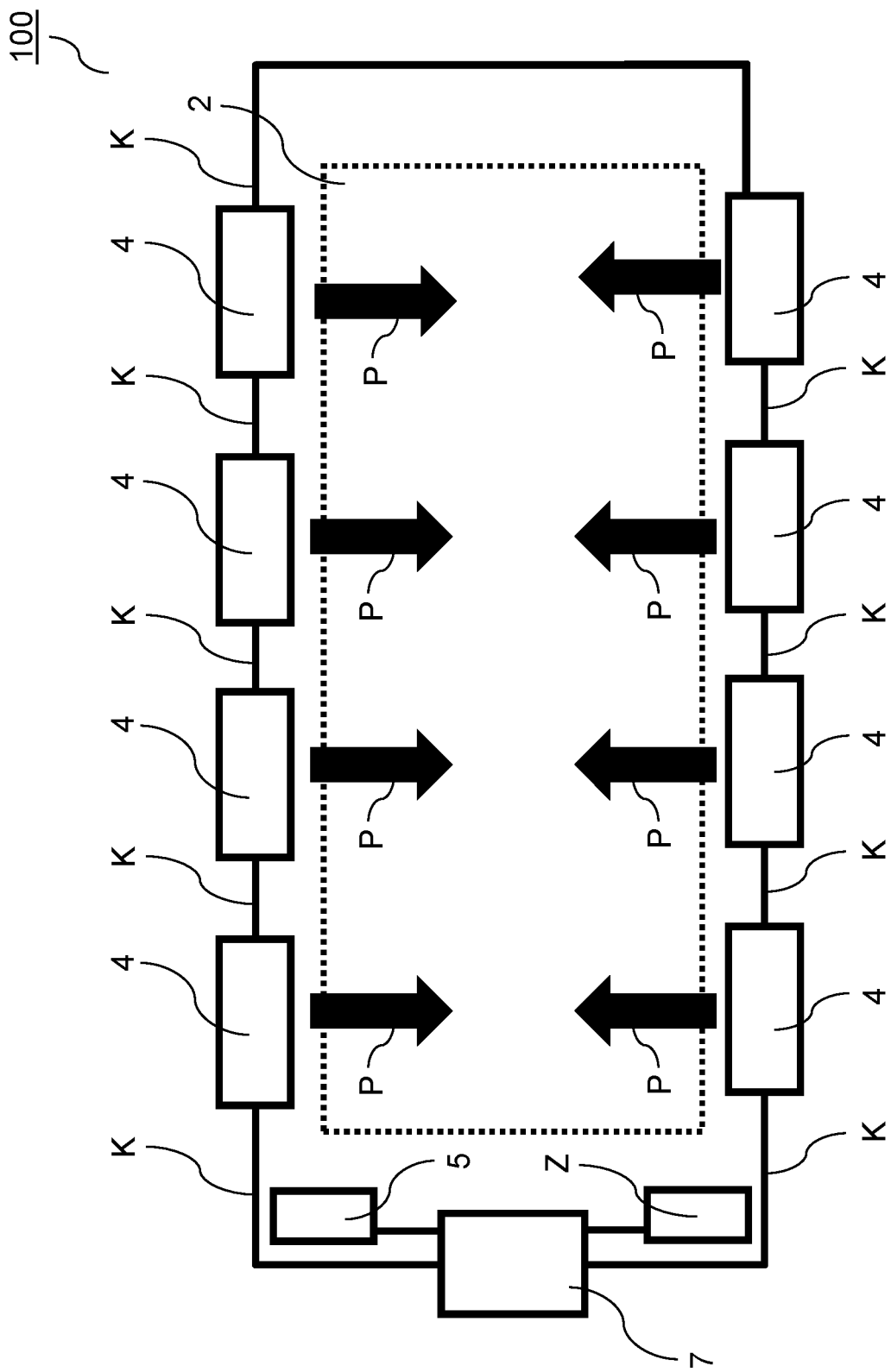
FIG. 16 is a block diagram illustrating the security system according to a fifth modification of the present disclosure.

In security system 100 illustrated in FIG. 16, detection device 3 is not disposed, but the ultrasonic wave speaker can detect a detecting target in monitoring area 2. That is, sound output device 4 (the superdirective speaker) functions as the detection device. Detection device 3 can be omitted by disposing the plurality of sound output devices 4, and thus the configuration becomes simple.

As described above, monitoring area 2 of a wide range can be covered by structuring any one of security systems 100 illustrated in FIG. 12 to FIG. 16 according to various environments. Further, even if an obstacle such as a wall or a plant exists, secure detection of a detecting target and emission of sound P can be realized by structuring any one of security systems 100 illustrated in FIG. 12 to FIG. 16.

As illustrated in FIG. 12, also in security systems 100 illustrated in FIG. 13 to FIG. 16, control unit 7 and the members are connected or the members are connected to each other by cable K, so that a signal can be exchanged or electric power can be supplied to the respective members. Further, wireless communication modules are mounted to control unit 7 and the members, respectively, and thus control unit 7 and members are connected by the wireless communication. As a result, a degree of installation freedom of security system 100 can be improved.

<Configurations of respective members in security system 100>

Figure 17:
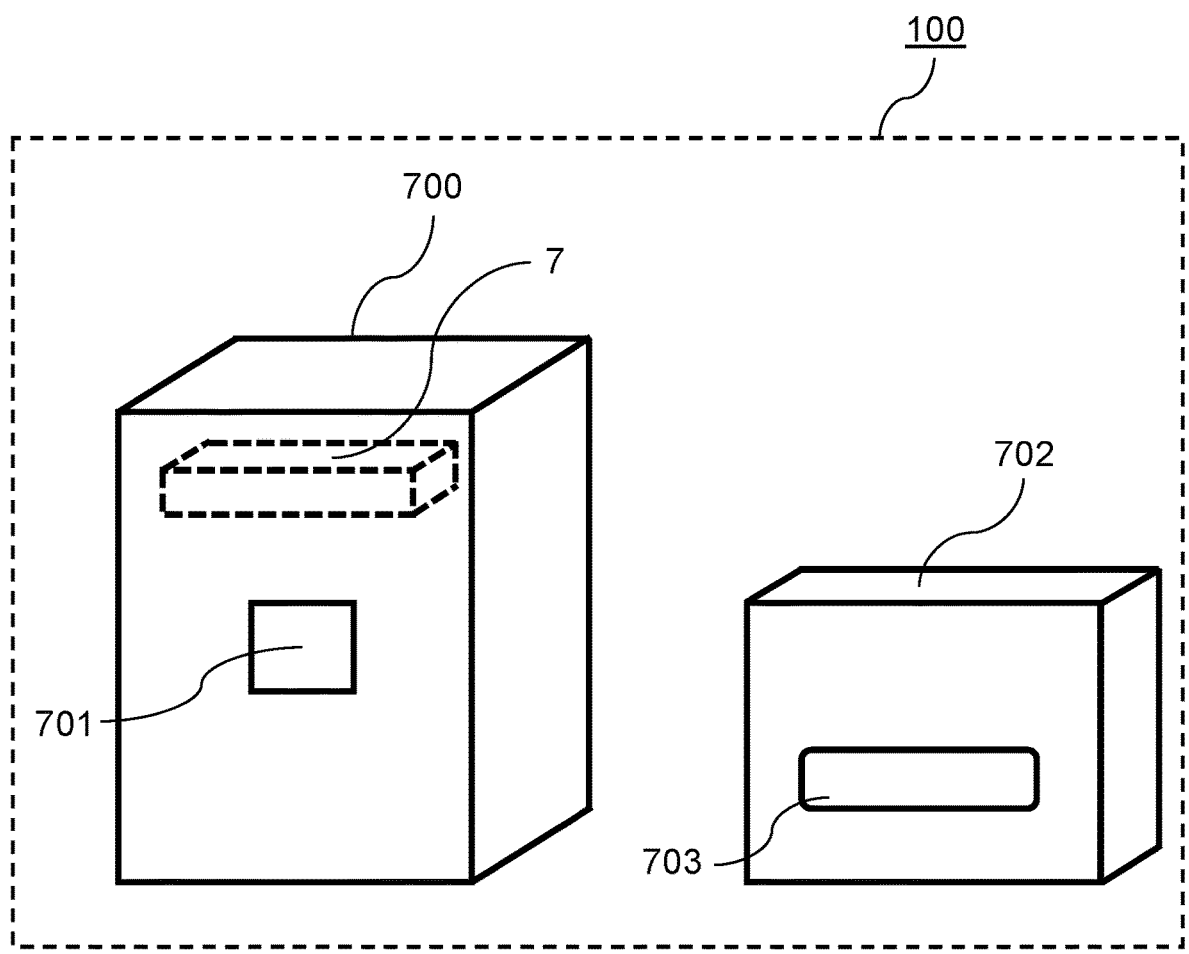
FIG. 17 is a diagram illustrating a configuration of the security system of the present disclosure.

Configurations of the respective members in security system 100 will be described below with reference to FIG. 17 to FIG. 19. FIG. 17 is a diagram illustrating security system 100 according to the present exemplary embodiment. In the above description, as the example, security system 100 is configured by individually disposing control unit 7, sound output device 4, and detection device 3. However, in FIG. 17, case 700 (a first member) stores control unit 7 and detection device 3 (not illustrated in FIG. 17) therein, and has detection window 701. Detection window 701 is a detection window for detection device 3. When the sensor of detection device 3 is an infrared sensor, detection window 701 is covered by a transparent member. As to detection window 701, in order to regulate a monitoring range of monitoring area 2, a detection range can be regulated by attaching a cylindrical member, not illustrated, to detection window 701. In the present exemplary embodiment illustrated in FIG. 17, since an outer shape of detection window 701 is square, a cylindrical body with a square cross section is jointed to an outer side of detection window 701 by welding, for example, so that the detection range can be regulated. At this time, the detection range can be regulated by changing a length of the cylindrical body, and thus monitoring area 2 can be securely detected as desired. Further, case 702 stores sound output device 4 (not illustrated in FIG. 17) therein, and has emission window 703. Emission window 703 is an emission window from which a sound (a warning sound or the like) is emitted. In such a manner, control unit 7 and sound output device 4 are stored in case 700, and detection device 3 is stored in another case 702. As a result, the degree of disposing freedom of security system 100 can be increased according to a state of monitoring area 2 and a monitoring environment.

Figure 18:
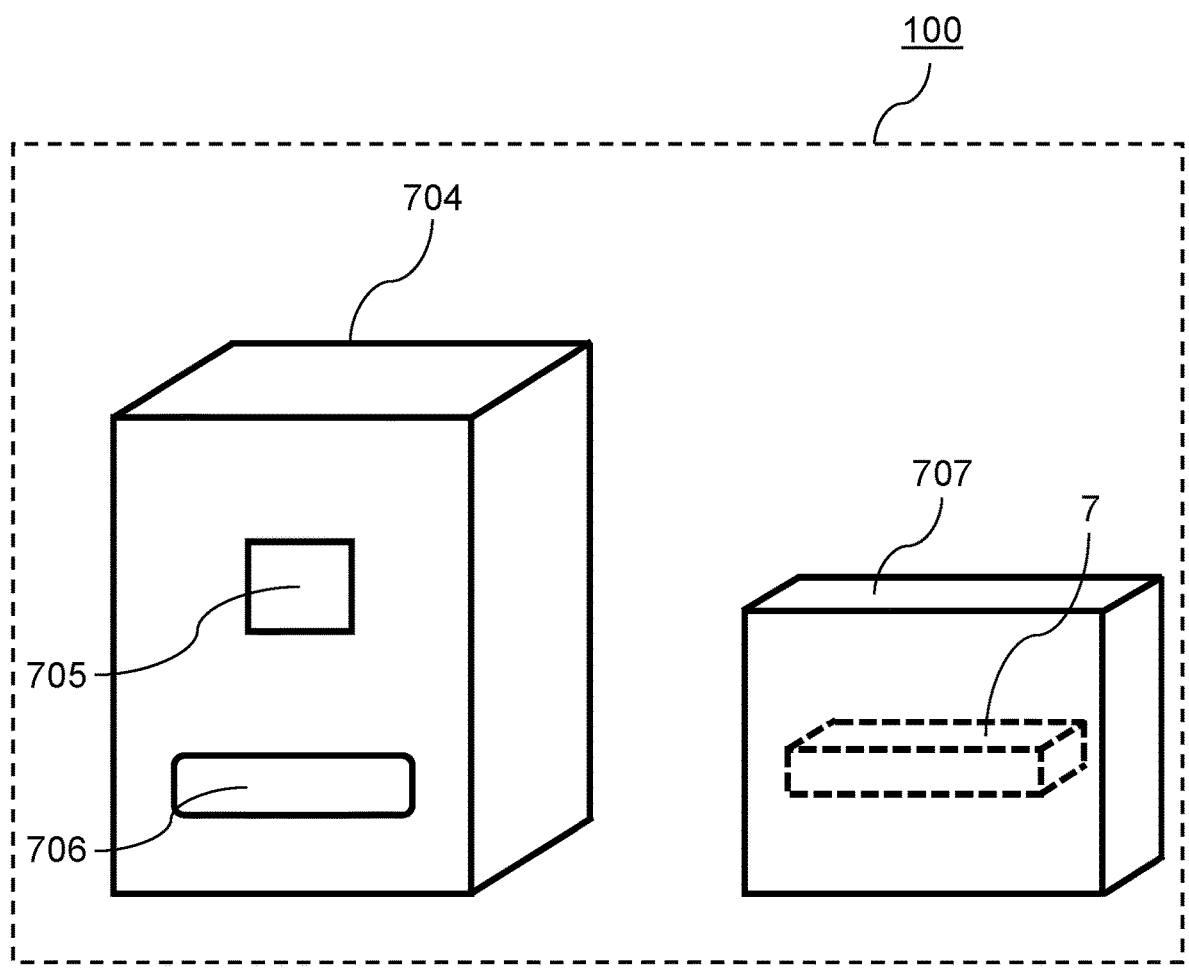
FIG. 18 is a diagram illustrating a configuration of the security system of the present disclosure.

Further, similarly FIG. 18 is a diagram illustrating another configuration of the respective units in security system 100. In FIG. 18, case 704 (a second member) stores sound output device 4 (not illustrated in FIG. 18) and detection device 3 (not illustrated in FIG. 18) therein. Further, case 704 has detection window 705 and emission window 706. Detection window 705 is a detection window for detection device 3, and emission window 706 is an emission window from which a sound (a warning sound or the like) is emitted. On the other hand, case 707 stores control unit 7 therein. In such a manner, control unit 7 is stored in case 707, and sound output device 4 and detection device 3 are stored in another case 704. As a result, case 704 that stores detection device 3 and sound output device 4 which are normally installed outdoors can be provided with dust-proof and moisture-resistant characteristics. The dust-proof and moisture-resistant characteristics of case 704 can provide environmentally resistant characteristics to detection device 3 and sound output device 4.

Figure 19:
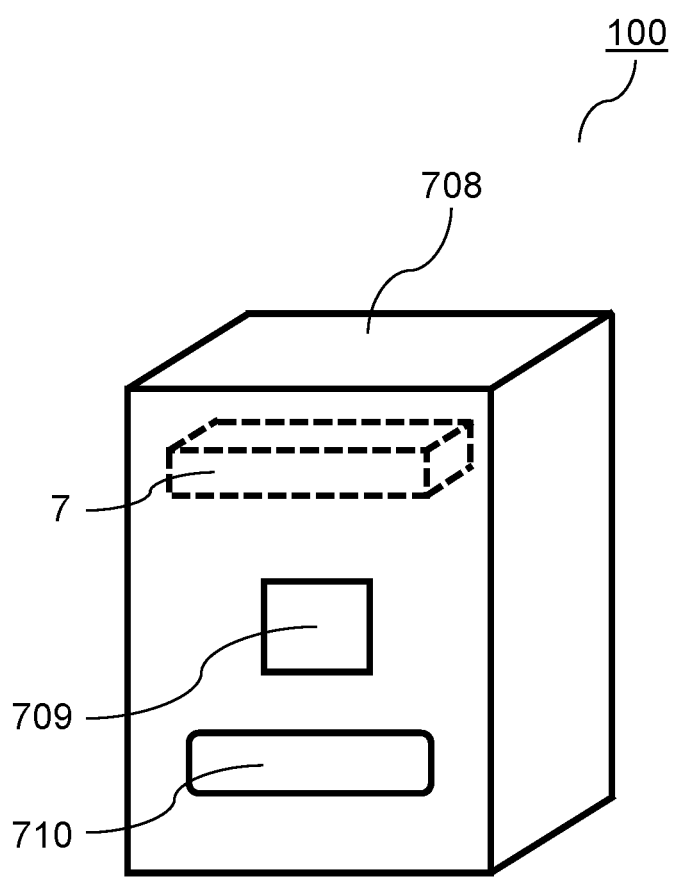
FIG. 19 is a diagram illustrating a configuration of the security system of the present disclosure.

Further, FIG. 19 is a diagram illustrating still another configuration of the members in security system 100. In FIG. 19, case 708 (a third member) stores sound output device 4 (not illustrated in FIG. 19), detection device 3 (not illustrated in FIG. 19), and control unit 7 therein. Case 708 has detection window 709 and emission window 710. Detection window 709 is a detection window for detection device 3, and emission window 710 is an emission window from which a sound (a warning sound or the like) is emitted. In such a manner, the entire system can be reduced in size by storing control unit 7, sound output device 4, and detection device 3 in one case 708. Further, cable K does not have to be drawn around, the installation of the system becomes very easy.

In such a manner, security systems 100 having the configurations illustrated in FIG. 17 to FIG. 19 are employed appropriately according to various states of monitoring area 2. As a result, the degree of installation freedom is remarkably improved, and thus installation work and maintenance after the installation become very simple.

Herein, various examples of the communication method in security systems 100 described with reference to FIG. 17 to FIG. 19 will be simply described.

As illustrated in FIG. 17, security system 100 (the sound reproduction system) has case 700 (the first member) to which detection device 3 and control unit 7 are mounted. Further, case 700 has a communication unit, and sound output device 4 has a communication unit. The communication unit of case 700 may communicate with the communication unit of sound output device 4 through the wired or wireless communication.

In another communication method, as illustrated in FIG. 18, security system 100 (the sound reproduction system) has case 704 (the second member) to which detection device 3 and sound output device 4 are mounted. Further, case 704 has a communication unit, and sound output device 4 has a communication unit. The communication unit of case 704 may communicate with the communication unit of sound output device 4 through the wired or wireless communication.

Note that as illustrated in FIG. 19, security system 100 (the sound reproduction system) may further include case 708 (a third member) to which the detector, the sound output unit, and the controller are mounted.

Note that in the above exemplary embodiment, the cases are described as the first to third members, but the members are not limited to the cases as long as the members can be integrally formed.

<Security System Having Liquid Crystal Monitor>

Figure 20:
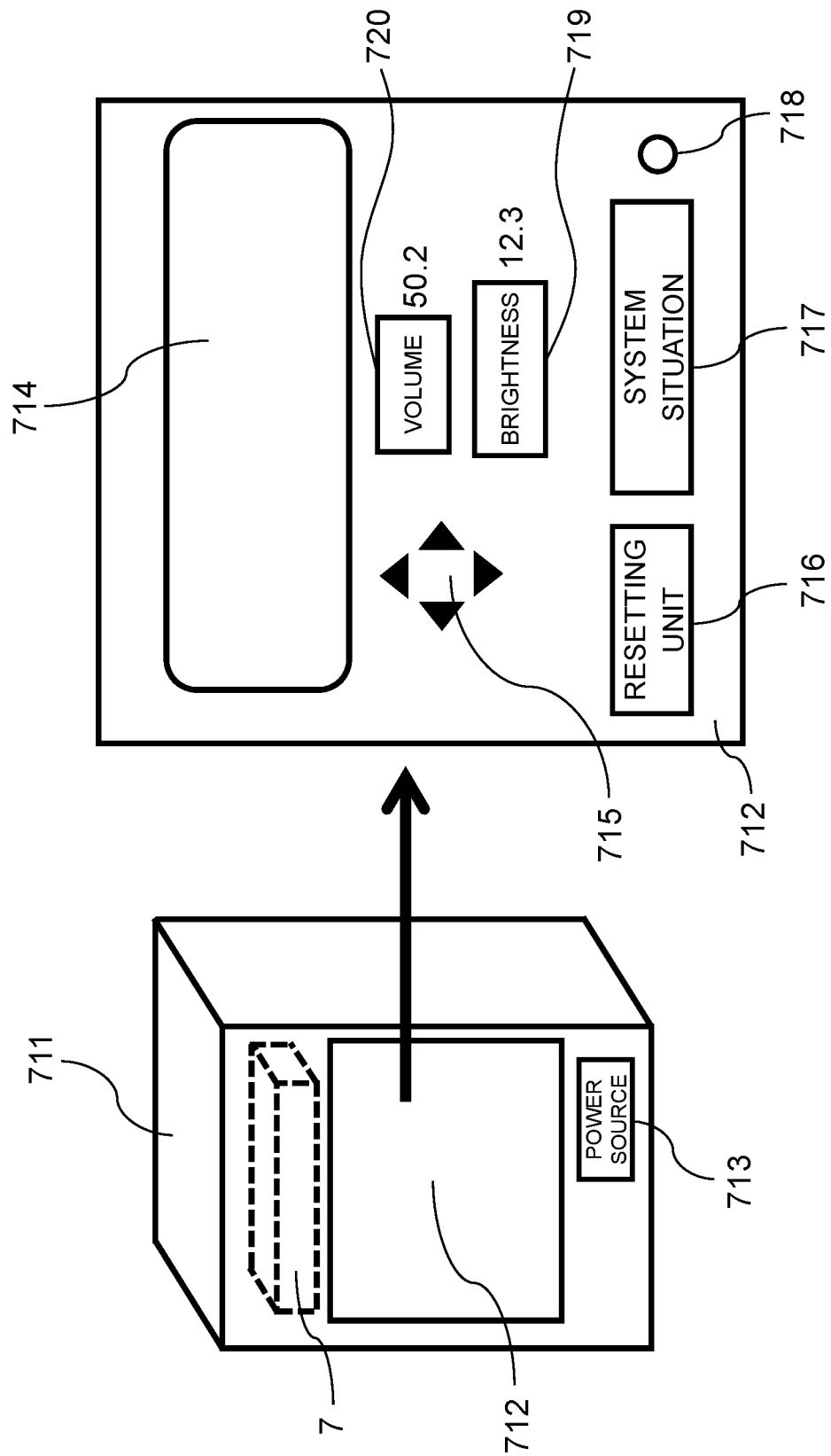
FIG. 20 is a diagram illustrating a configuration of the security system of the present disclosure.

FIG. 20 is a diagram illustrating security system 100 according to one exemplary embodiment of the present disclosure, and case 711 stores control unit 7 therein. Liquid crystal monitor 712 that is controlled by control unit 7 is mounted to a surface of case 711. Liquid crystal monitor 712 is equivalent to liquid crystal monitor 190 illustrated in FIG. 7. Switch 713 is a main switch of security system 100. Activation of security system 100 is controlled by turning on or off switch 713. In the present exemplary embodiment, a touch panel is disposed to liquid crystal monitor 712, and desired information can be input by touching the surface of liquid crystal monitor 712 with a finger and the like. Note that a right side of FIG. 20 illustrates a diagram in which liquid crystal monitor 712 is enlarged.

Upon pressing switch 713, control unit 7 starts checking the entire system, and simultaneously control unit 7 performs control so that information appears on liquid crystal monitor 712. In FIG. 20, a video and the like captured by monitoring camera 5 (see FIG. 2) appear on display unit 714 of liquid crystal monitor 712. Control unit 7 can be operated by operation unit 715. When the entire system is in a defective state, the entire system can be reset by operating operation unit 715 and resetting unit 716. Further, when a user desires to stop a sound that is being emitted from sound output device 4, the user operates resetting unit 716.

A situation of the entire system is displayed on display unit 717. A situation mark is displayed on display unit 718 on a lower right part of liquid crystal monitor 712. For example, when the situation mark to be displayed on display unit 718 is "○", this indicates that the system is satisfactory. When the situation mark is "Δ", this indicates that a part of the system has slight defect. When the situation mark is "X", this indicates that the system cannot operate.

Luminance that indicates brightness of liquid crystal monitor 712 is displayed next to display unit 719. A volume indicating a volume level of a sound to be emitted from sound output device 4 is displayed next to display unit 720.

In a case where the volume or the luminance value is desired to be changed, a following operation is performed. First, the case where the volume is desired to be changed will be described. Display unit 720 associated with an item desired to be changed (herein, the volume) is touched. Thereafter, a numerical value of the volume to be displayed next to display unit 720 is changed by operating operation unit 715. When the luminance is desired to be changed, display unit 719 is touched. Thereafter, a numerical value of the luminance to be displayed next to display unit 719 is changed by operating operation unit 715.

Further, when an image displayed on display unit 714 is desired to be scrolled, display unit 714 is first touched. Thereafter, operation unit 715 is operated. Control unit 7 recognizes the operation of operation unit 715, and control unit 7 operates drive unit 5a according to a pressed portion of operation unit 715 so as to move monitoring camera 5.

In such a manner, various functions are displayed on liquid crystal monitor 712, and a function of a touch panel is provided to liquid crystal monitor 712. As a result, operability of the entire system can be remarkably improved.

Third Exemplary Embodiment

A third exemplary embodiment will be described below with reference to FIG. 7.

In the third exemplary embodiment, detector 110 in FIG. 7 is a face detector. The face detector is a function that is realized by a central processing unit (a CPU) executing a program. When a target (an intruder) enters an imaging range of an imaging unit, a face of the intruder can be detected. Specifically, a storage unit is disposed as a part of the system, and a plurality of face model data for recognizing faces of people are stored in the storage unit in advance. The face model data include a plurality of data such as face directions, shapes, sizes, and positions of eyes, noses, and mouths. Detector 110 matches the face model data with image data transmitted successively from the imaging unit so as to determine whether a portion with high similarity exists between the image data and the face model data. When the portion with high similarity exists, detector 110 determines that a target face exists in the imaging range of the imaging unit.

Detector 110 includes an attribute determination unit (not illustrated) and a face motion detector (not illustrated). The attribute determination unit determines an attribute of a customer having the face based on the face detected in the imaging range. The attribute includes at least one of age and sex. Note that the attribute determination unit may estimate the attribute such as age and sex by using body shape and body motion instead of face.

As a method for estimating age and sex, pattern matching data for estimating age and sex are stored in memory 170 in advance. The attribute determination unit, then, verifies the image data of a face against the pattern matching data. As a result, the attribute determination unit determines shapes of portions that are specific to sex and age (for example, eyes, nose, mouth, eyebrows, ears, body framework, and neck), presence/non-presence of wrinkles around tail of eyes, nape, and mouth, and states of hair and makeup so as to estimate age and sex.

Detector 110 analyzes a plurality of image data imaged and generated by camera unit 150 on a time-series basis to detect a customer's face motion based on a change in a customer's face position. For example, when detecting a motion that the customer's face moves from a front to a side within a certain time and then to the front, detector 110 can detect that the head is shaken.

A function of detector 110 is realized by the CPU executing a program. Detector 110 detects a customer's eye direction detected in the imaging range, based on the image data generated by memory 170. As an eye direction detecting method, any publicly-known method can be used.

For example, a three-dimensional face image model is created from the image data, and is verified against three-dimensional face model data stored in advance so that a face direction is obtained. Further, an eyeball direction is obtained from a position relationship between both iris and pupil of the eyes and sclera of the eyes corresponding to the eyeballs in the image data. The eye direction can be detected from the face direction and the eyeball direction.

In such a manner, an attribute of an intruder is determined, namely, an intruder considered to particularly be an illegal intruder, is specified, and a warning sound is output from the superdirective speaker that is the sound output unit. As a result, a warning can effectively be issued to the illegal intruder more selectively.

For example, the attribute is classified into three categories including "adult male", "adult female", and "child". Herein, an operation will be described with reference to a flowchart in FIG. 23. Note that the operation similar to that in FIG. 8 is denoted by the identical reference sign, and description thereof is omitted.

Figure 23:
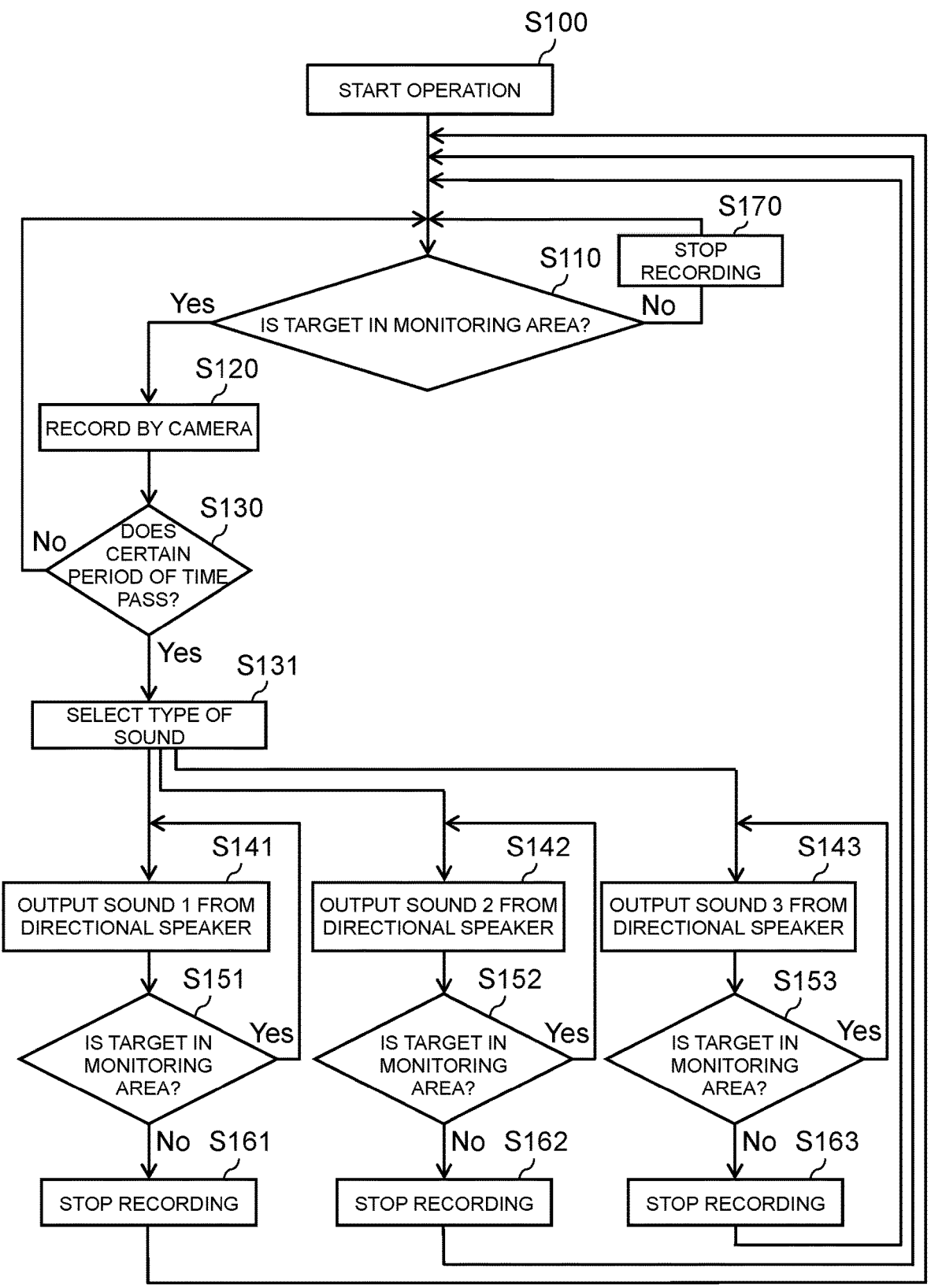
FIG. 23 is a flowchart describing the security system according to the third exemplary embodiment.

In step S131 illustrated in FIG. 23, a sound is selected according to the classified attribute. For example, if the attribute is determined as "adult male", the process proceeds to step S141, sound 1 (herein, a loud warning sound) is output. Since the flow thereafter is similar to the flow in FIG. 8, description thereof is omitted. If the attribute is determined as "adult female", the process proceeds to step S142, sound 2 (a warning sound that is less loud than sound 1) is output. Further, if the attribute is determined as "child", the process proceeds to step S143, and sound 3 (gentle sound) is output. Since the other parts of the operation are similar to those in FIG. 8, description thereof is omitted herein.

Note that a message or music may be output instead of a sound. A sound can be set variously so that, for example, if the determination is made that a child intrudes, a gentle sound that says "please get out of premises" is output.

A type of the sound to be output from superdirective speaker 404 can be changed according to the attribute.

Note that step S140 in FIG. 8 corresponds to step S141, step S142, or step S143 according to the present exemplary embodiment. Step S150 in FIG. 8 corresponds to step S151, step S152, or step S153 according to the present exemplary embodiment. Step S160 in FIG. 8 corresponds to step S161, step S162, or step S163 according to the present exemplary embodiment.

In step S161, the recording is stopped and simultaneously the output of sound 1 may be stopped. In S162 and S163, similarly to S161, the output of sound 2 or sound 3 may be stopped. The setting is not limited to the present exemplary embodiment, and can be made variously.

Modification of Third Exemplary Embodiment

Then a case where an emotion is detected and a type of a sound is selected according to the detected emotion will be described below with reference to FIG. 21 and FIG. 22.

People experience various emotions such as pleasure and surprise. In FIG. 21, various emotions experienced by people are arranged on a plane along two axes of an arousal level and a valence level. The arousal level is an arousal degree, and the valence level is a valence degree. As illustrated in FIG. 21, it is known that various emotions experienced by people can be arranged circularly on the plane.

In order to detect these emotions, detector 110 uses at least one data of, for example, information acquired from a facial image (positions and shapes of mouth, eyes, and eyebrows), sound, linguistic expression, and gesture. Such non-physiological data are obtained by at least one of, for example, a camera, a microphone, a time-of-flight (TOF) sensor, a millimeter-wave sensor, a millimeter-wave radar, and a walking sensor. Estimating unit 600 includes arousal component calculating unit 601 and valence component calculating unit 602. Arousal component calculating unit 601 is a processor that calculates an arousal level indicating an arousal degree of an intruder (see FIG. 21) based on the data acquired by detector 110. More specifically, arousal component calculating unit 601 calculates the arousal level based on the data acquired by detector 110. Arousal component calculating unit 601 has parameters to be reference values of various data, and compares the data acquired by detector 110 with the reference values to calculate the arousal level.

Valence component calculating unit 602 is a processor that calculates a valence level indicating a valence degree of an intruder (see FIG. 21) based on the data acquired by detector 110. More specifically, valence component calculating unit 602 calculates the valence level based on the data acquired by detector 110. Valence component calculating unit 602 has parameters to be reference values of the various data, and compares the data acquired by detector 110 with the reference values to calculate the valence level.

Emotion estimating unit 603 is a processor that estimates an emotion of an intruder based on the arousal level calculated by arousal component calculating unit 601 and the valence level calculated by valence component calculating unit 602. Emotion estimating unit 603 has, for example, a predetermined association between the arousal level and the valence level of people (for example, a Russell's circumplex model illustrated in FIG. 21) in a memory in advance. Emotion estimating unit 603 acquires the arousal level calculated by arousal component calculating unit 601, and the valence level calculated by valence component calculating unit 602. Emotion estimating unit 603 then selects an emotion associated with the acquired arousal level and valence level according to the predetermined association to estimate an emotion of the intruder.

When the Russell's circumplex model is used as the predetermined association, emotion estimating unit 603 plots points associated with the acquired arousal level and valence level on a plane where a vertical axis represents the arousal level and a horizontal axis represents the valence level. Emotion estimating unit 603 then estimates an emotion allocated to a point in the Russell's circumplex model as an emotion of the intruder.

Emotion estimating unit 603 has parameters to be reference values for estimating emotions based on the arousal level and the valence level. The parameters are, for example, reference values indicating a ratio for placing an emphasis on the arousal level or the valence level. Emotion estimating unit 603 estimates an emotion of an intruder based on the parameters according to the arousal level and the valence level.

Figure 21:
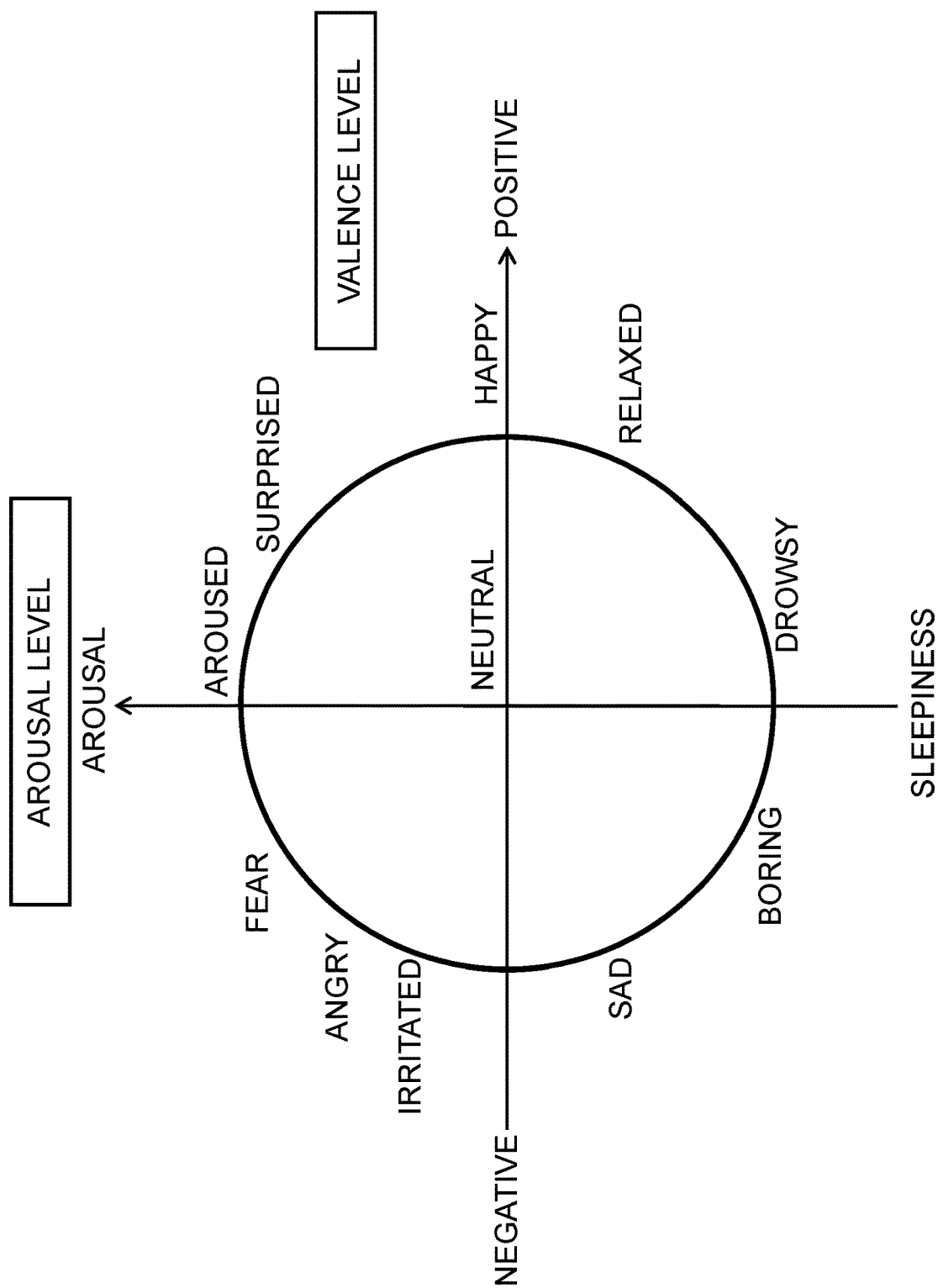
FIG. 21 is a diagram in which human emotions are disposed in a toric form.
Figure 22:
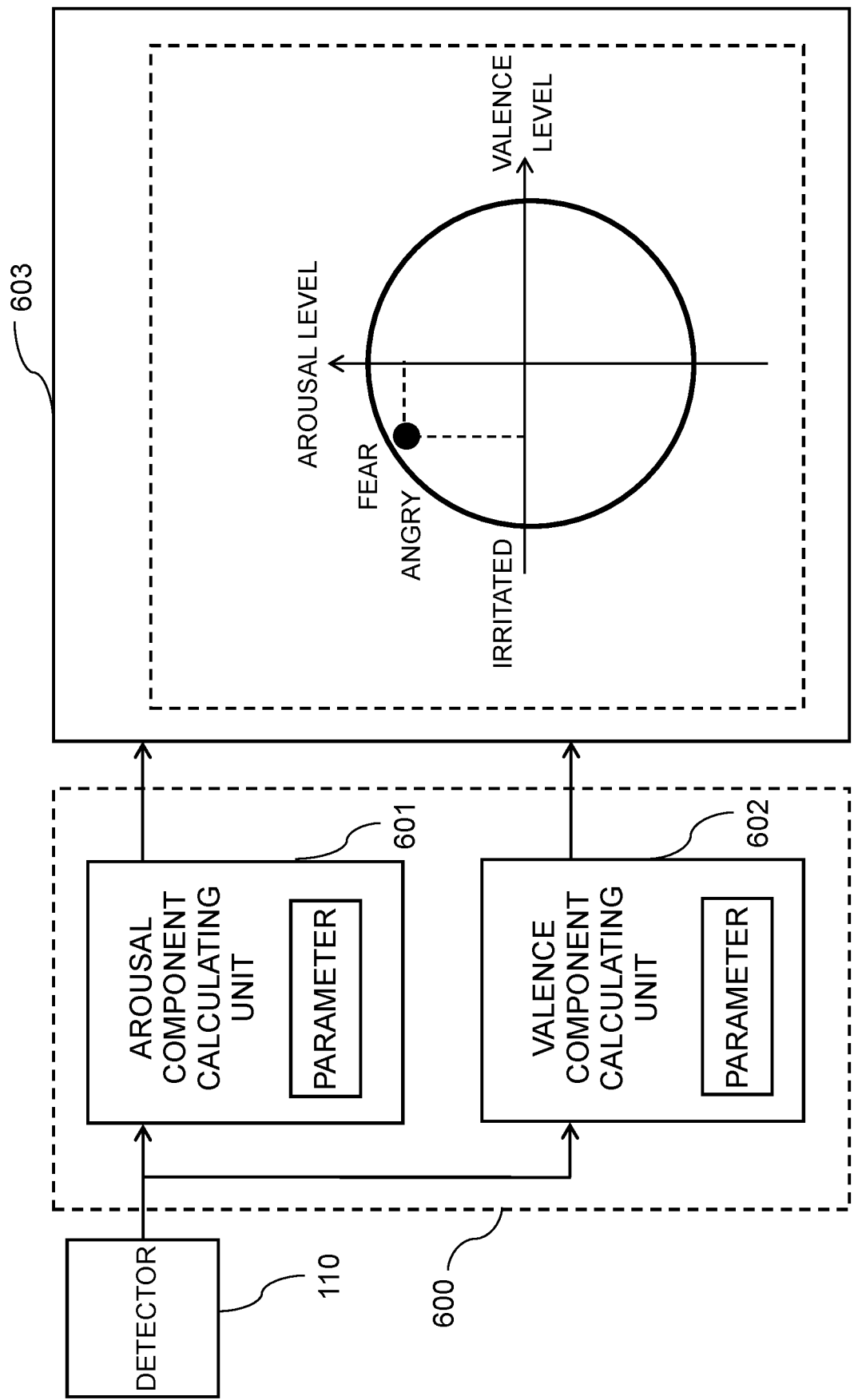
FIG. 22 is a schematic diagram illustrating the security system according to a third exemplary embodiment.

Herein, as illustrated in FIG. 22, emotion estimating unit 603 determines, as an illegal intruder, particularly an intruder who feels emotions such as fear, anger, and irritation in an upper left quadrant of the Russell's circumplex model. In a flowchart illustrated in FIG. 23, in step 131, sound 1 (the warning sound for intruder) is selected, and the process proceeds to step 141. In step 141, superdirective speaker 404 as sound output unit 120 outputs the warning sound. An intruder who feels emotions in a right quadrant of Russell's circumplex model in FIG. 21 is not determined as an illegal intruder. Then, for example, the process proceeds to step 142, and sound 2 (bouncy melody) can be output.

In such a manner, a warning can be effectively issued to an illegal intruder in a more selective manner.

The following describes one example, based on the Russell's circumplex model illustrated in FIG. 21, as to how to determine an intruder and what sound is output based on the determined result.

When an emotion in the upper left quadrant is detected in the Russell's circumplex model illustrated in FIG. 21, the intruder is regarded as a suspicious individual, and when an emotion in an upper right quadrant is detected, the intruder is regarded as a guest. When an emotion in a lower quadrant is detected, the intruder is regarded as a habitant. For example, when the intruder is regarded as a suspicious individual, a loud warning sound is output. When the intruder is regarded as a guest, melody is output. When the intruder is regarded as a habitant, no sound is output.

Further, in order to determine that the intruder is a habitant, a method for storing an image of the habitant in advance and determining the intruder based on image recognition can be also used in combination.

Note that in the description about the above exemplary embodiment, the security device is used as the sound reproduction device, and the security system is used as the sound reproduction system. However, the sound reproduction device or the sound reproduction system of the present disclosure is not limited to the security device or the security system. A use application is not limited to the security device or the security system as long as the device or system detects an object and needs to output a sound according to the detected result.

Note that in the description about the present disclosure, the object is a person or an animal as an example, but is not limited to them. Examples of the object include a stone, a motorbike, and an automobile. The object, however, does not include intangible things such as light and sound.

INDUSTRIAL APPLICABILITY

The present disclosure is useful as the sound reproduction device to be used in the security device and the like in an individual housing, a complex housing, and a commercial facility. Such a sound reproduction device can emit a warning and the like precisely to a target in a monitoring area, and can appropriately control a sound leakage and a noise that affect neighborhood inhabitants.

REFERENCE MARKS IN THE DRAWINGS

1: security device (sound reproduction device)
2: monitoring area (detecting area)
3: detection device
3a: infrared sensor
4: sound output device
4a: drive unit
5: monitoring camera
5a: drive unit
6: building
7: control unit
8: controller
9: communication network
10: center server
11: external agency
100: security system (sound reproduction system)
110: detector
120: sound output unit
140: controller
150: camera unit
160: image processor
170: memory 180: communication unit
190: liquid crystal monitor
200: internal memory
210: card slot
220: memory card
230: zoom lever
240: operation member
301: ultrasonic actuator
302: base
303: supporting column
304: piezoelectric element
305: diaphragm
306: cone
401: actuator array
402: substrate
403: cover
404: superdirective speaker
501, 502: arrow
600: estimating unit
601: arousal component calculating unit
602: valence component calculating unit
603: emotion estimating unit
700, 702, 704, 707, 708, 711: case (member)
701, 705, 709: detection window
703, 706, 710: emission window
712: liquid crystal monitor
713: switch
714, 717, 718, 719, 720: display unit
715: operation unit
716: resetting unit
1001: transmitter
1002: receiver
1003: target
1101: transmission time
1102: reception time
BS: burst wave
K: cable
L1, L2: detecting area
P: sound
Z: microphone

The invention claimed is:

1. A sound reproduction system comprising:
a detector that detects an object in a detecting area;
a sound output unit having a directional speaker that outputs a sound;
a controller that controls the detector and the sound output unit; and
a first member to which the detector and the controller are mounted,
wherein
directivity of the directional speaker is set for the detecting area,
when the detector detects the object, the controller receives a signal from the detector, and
the controller controls the directional speaker so that the directional speaker outputs a sound in accordance with the signal,
the first member includes a first communication unit,
the sound output unit includes a second communication unit, and
the first communication unit and the second communication unit communicate with each other through wired or wireless connection.

2. The sound reproduction system according to claim 1, wherein
the detector, the sound output unit, and the controller are configured separately, and
the detector, the sound output unit, and the controller communicate with each other through wired or wireless connection.

3. The sound reproduction system according to claim 1, wherein
the detector includes a plurality of detection devices, and
each of the plurality of detection devices includes a communication unit.

4. The sound reproduction system according to claim 1, wherein
the sound output unit includes a plurality of directional speakers, and
each of the plurality of directional speakers includes a communication unit.

5. The sound reproduction system according to claim 1, wherein
the detector includes a drive unit that displaces the detector,
the detector includes a camera or a sensor, and
the controller controls the detector and the drive unit.

6. The sound reproduction system according to claim 1, further comprising a drive unit that displaces the directional speaker,
wherein the controller controls the directional speaker and the drive unit.

7. The sound reproduction system according to claim 1, wherein
the directional speaker includes a function of the detector, and
a frequency of an ultrasonic wave with which an audible wave is carried when the directional speaker functions as a loudspeaker is different from a frequency of an ultrasonic wave with which the object is detected when the directional speaker functions as the detector.

8. A sound reproduction system comprising:
a detector that detects an object in a detecting area;
a directional speaker that outputs a sound; and
a controller that controls the detector and the directional speaker,
wherein
the controller determines a situation in the detecting area based on a signal detected by the detector,
the directional speaker outputs the sound by being controlled by the controller,
an attribute of the object detected in the detecting area is determined based on information acquired by the detector, and
the sound is in accordance with the attribute detected by the detector.

9. A sound reproduction system comprising:
a detector that detects an object in a detecting area;
a directional speaker that outputs a sound;
a controller that controls the detector and the directional speaker; and
an emotion estimating unit that estimates an emotion of the object,
wherein
the controller determines a situation in the detecting area based on a signal detected by the detector,
the directional speaker outputs the sound by being controlled by the controller,
the emotion estimating unit estimates the emotion of the object detected in the detecting area, based on information acquired by the detector, and
the sound is in accordance with the emotion estimated by the emotion estimating unit.

10. The sound reproduction system according to claim 9, further comprising:
an arousal component calculating unit that calculates an arousal level that is an arousal degree, based on information acquired by the detector; and
a valence component calculating unit that calculates a valence level which is a valence degree of a person, based on the information acquired by the detector,
wherein
the emotion estimating unit estimates the emotion of the object from the arousal level and the valence level, and
the sound is in accordance with the emotion estimated by the emotion estimating unit.

11. The sound reproduction system according to claim 8, wherein
the directional speaker includes a function of the detector, and
a frequency of an ultrasonic wave with which an audible wave is carried when the directional speaker functions as a loudspeaker is different from a frequency of an ultrasonic wave with which the object is detected when the directional speaker functions as the detector.

12. The sound reproduction system according to claim 8, wherein an emission angle of the directional speaker is set between 0° to ±30°, inclusive.

13. The sound reproduction system according to claim 8, wherein
an area of a detection area of the detector in the detecting area is represented by L1,
an area of an area where the sound arrives from the directional speaker in the detecting area is represented by L2, and
the detection device and the directional speaker are set so that L1≥L2.

14. The sound reproduction system according to claim 8, wherein
the directional speaker includes a superdirective speaker.

15. The sound reproduction system according to claim 14, wherein
the superdirective speaker includes an ultrasonic actuator, and
the ultrasonic actuator includes a piezoelectric element.

16. The sound reproduction system according to claim 8, wherein the directional speaker functions as the detector.

17. The sound reproduction system according to claim 8, further comprising a case,
wherein the detector and the directional speaker are disposed in the case.

18. The sound reproduction system according to claim 9, wherein
the directional speaker includes a function of the detector, and
a frequency of an ultrasonic wave with which an audible wave is carried when the directional speaker functions as a loudspeaker is different from a frequency of an ultrasonic wave with which the object is detected when the directional speaker functions as the detector.

19. The sound reproduction system according to claim 9, wherein an emission angle of the directional speaker is set between 0° to ±30°, inclusive.

20. The sound reproduction system according to claim 9, wherein
an area of a detection area of the detector in the detecting area is represented by L1,
an area of an area where the sound arrives from the directional speaker in the detecting area is represented by L2, and
the detection device and the directional speaker are set so that L1≥L2.

21. The sound reproduction system according to claim 9, wherein
the directional speaker includes a superdirective speaker.

22. The sound reproduction system according to claim 21, wherein
the superdirective speaker includes an ultrasonic actuator, and
the ultrasonic actuator includes a piezoelectric element.

23. The sound reproduction system according to claim 9, wherein the directional speaker functions as the detector.

24. The sound reproduction system according to claim 9, further comprising a case,
wherein the detector and the directional speaker are disposed in the case.

* * * * *